US009761456B2

(12) United States Patent
Nakatani et al.

(10) Patent No.: US 9,761,456 B2
(45) Date of Patent: Sep. 12, 2017

(54) METHOD OF MANUFACTURING SEMICONDUCTOR DEVICE AND SUBSTRATE PROCESSING APPARATUS

(71) Applicant: Hitachi Kokusai Electric Inc., Tokyo (JP)

(72) Inventors: Kimihiko Nakatani, Toyama (JP); Kazuhiro Harada, Toyama (JP); Masahito Kitamura, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/947,523

(22) Filed: Nov. 20, 2015

(65) Prior Publication Data

US 2016/0148811 A1 May 26, 2016

(30) Foreign Application Priority Data

Nov. 25, 2014 (JP) .................................. 2014-238144

(51) Int. Cl.
*H01L 21/44* (2006.01)
*H01L 21/28* (2006.01)
(Continued)

(52) U.S. Cl.
CPC ........ *H01L 21/28088* (2013.01); *C23C 16/30* (2013.01); *C23C 16/45529* (2013.01)

(58) Field of Classification Search
CPC ................................................ H01L 21/28088
See application file for complete search history.

(56) References Cited

U.S. PATENT DOCUMENTS 6,444,265 B1  9/2002 Froschle et al.
6,468,924 B2 * 10/2002 Lee .......................... C23C 16/34
                                                        257/E21.293
(Continued)

FOREIGN PATENT DOCUMENTS

JP     10-223563     8/1998
JP     2000506683    5/2000
(Continued)

OTHER PUBLICATIONS

Office Action in corresponding Japanese Patent Application No. 2014-238144, prepared on Sep. 28, 2016, with English Translation.
(Continued)

*Primary Examiner* — Bradley K Smith
(74) *Attorney, Agent, or Firm* — Edell, Shapiro & Finnan LLC

(57) ABSTRACT

A method of manufacturing a semiconductor device includes (a) providing a substrate and (b) forming a film including a first element, a second element and a third element in a same group as the second element on the substrate by performing a cycle a predetermined number of times, the cycle including: (b-1) supplying a halogen-based source gas including the first element to the substrate; (b-2) supplying a first reactive gas including the second element and reactive with the halogen-based source gas; and (b-3) supplying a second reactive gas including the third element without mixing the second reactive gas with the first reactive gas, wherein the second reactive gas is reactive with the halogen-based source gas and unreactive with the first reactive gas.

7 Claims, 12 Drawing Sheets

(51) Int. Cl.
*C23C 16/30* (2006.01)
*C23C 16/455* (2006.01)

(56) References Cited

U.S. PATENT DOCUMENTS

| | | | |
|---|---|---|---|
| 6,846,516 B2 * | 1/2005 | Yang | C23C 16/45531 427/255.32 |
| 2003/0129309 A1 * | 7/2003 | Otsuki | C23C 16/0218 427/255.28 |
| 2012/0214300 A1 | 8/2012 | Kaga et al. | |

FOREIGN PATENT DOCUMENTS

| | | |
|---|---|---|
| JP | 2001156024 A | 6/2001 |
| JP | 2012184499 A | 9/2012 |
| KR | 1020120095297 A | 8/2012 |

OTHER PUBLICATIONS

Office Action in corresponding Korean Patent Application No. 10-2015-0162621, mailed on Nov. 11, 2016, with English translation.

* cited by examiner

METHOD OF MANUFACTURING SEMICONDUCTOR DEVICE AND SUBSTRATE PROCESSING APPARATUS

CROSS REFERENCE TO RELATED APPLICATIONS

This application claims foreign priority under 35 U.S.C. §119(a)-(d) to Application No. JP 2014-238144 filed on Nov. 25, 2014, the entire contents of which are hereby incorporated by reference.

FIELD OF THE INVENTION

The present invention relates to a method of manufacturing a semiconductor device and a substrate processing apparatus.

BACKGROUND

In an LSI manufacturing process in recent times, a transistor has a gate stack structure in which a high-K film having permittivity of more than 4 is formed on a silicon (Si), and a conductive thin film is further formed on the high-K film to control a threshold value voltage of the transistor. In the structure, various kinds of conductive thin films are used as gate electrodes to control power consumption of the transistor. The conductive thin film has an inherent work function (WF) of the thin film. The threshold value voltage of the transistor can be controlled by adjusting the work function. The metal gate electrode may be a metal nitride film (for example, a titanium nitride film (a TiN film)) (Japanese Unexamined Patent Application, First Publication No. 2011-6783).

SUMMARY

In recent times, an electrode including a conductive thin film that can variously adjust values of work functions according to uses may be required. In particular, a conductive thin film having a work function value lower than that of a titanium nitride film used in the related art may be required.

The present invention is directed to provide a technology capable of adjusting a work function and forming a conductive thin film having a low work function value.

According to an aspect of the present invention, there is provided a method of manufacturing a semiconductor device, including: (a) providing a substrate; and (b) forming a film including a first element, a second element and a third element in a same group as the second element on the substrate by performing a cycle a predetermined number of times, the cycle including: (b-1) supplying a halogen-based source gas including the first element to the substrate; (b-2) supplying a first reactive gas including the second element and reactive with the halogen-based source gas; and (b-3) supplying a second reactive gas including the third element without mixing the second reactive gas with the first reactive gas, wherein the second reactive gas is reactive with the halogen-based source gas and unreactive with the first reactive gas.

DETAILED DESCRIPTION

A threshold value voltage (Vth) is provided as an important parameter that represents features of MOSFET. The threshold value voltage is determined by a work function of an electrode. The work function of the electrode can be tuned (adjusted, modulated) by a metal film that constitutes the electrode. Values of the work functions required in a P-type transistor and an N-type transistor of the transistor are different, the P-type transistor requires 5.0 eV or more, and the N-type transistor requires 4.3 eV or less. In addition, in order to suppress a standby power of the transistor, a conductive thin film having a work function (about 4.6 eV) around a mid-gap is required. In addition, a channel material is changed from silicon (Si) to silicon germanium (SiGe) and germanium (Ge), and a conductive thin film having a work function lower than that of the related art is required. In addition, according to uses, the other values may be required. In this case, it is preferable to adjust the work function by one film including the same element composition.

In order to deal with such requirements, for example, a conductive thin film having a work function of 4.6 eV or less on a hafnium oxide film (a HfO film) and capable of modulating a value of the work function is required. While a titanium nitride film (a TiN film) serving as an example of a metal gate electrode has many advantages such as high reliability, low resistance, good step coating, and so on, a work function on an HfO film is about 4.8 eV that is higher than that of the above-mentioned requirements.

Here, a work function of a material has a correlation with electronegativity of an element that composes the material. Providing that electronegativity of Pauling is X and a work function is W, a relation of Equation 1 is satisfied.

$$W=2.27X+0.34 \quad \text{[Equation 1]}$$

Figure 1:
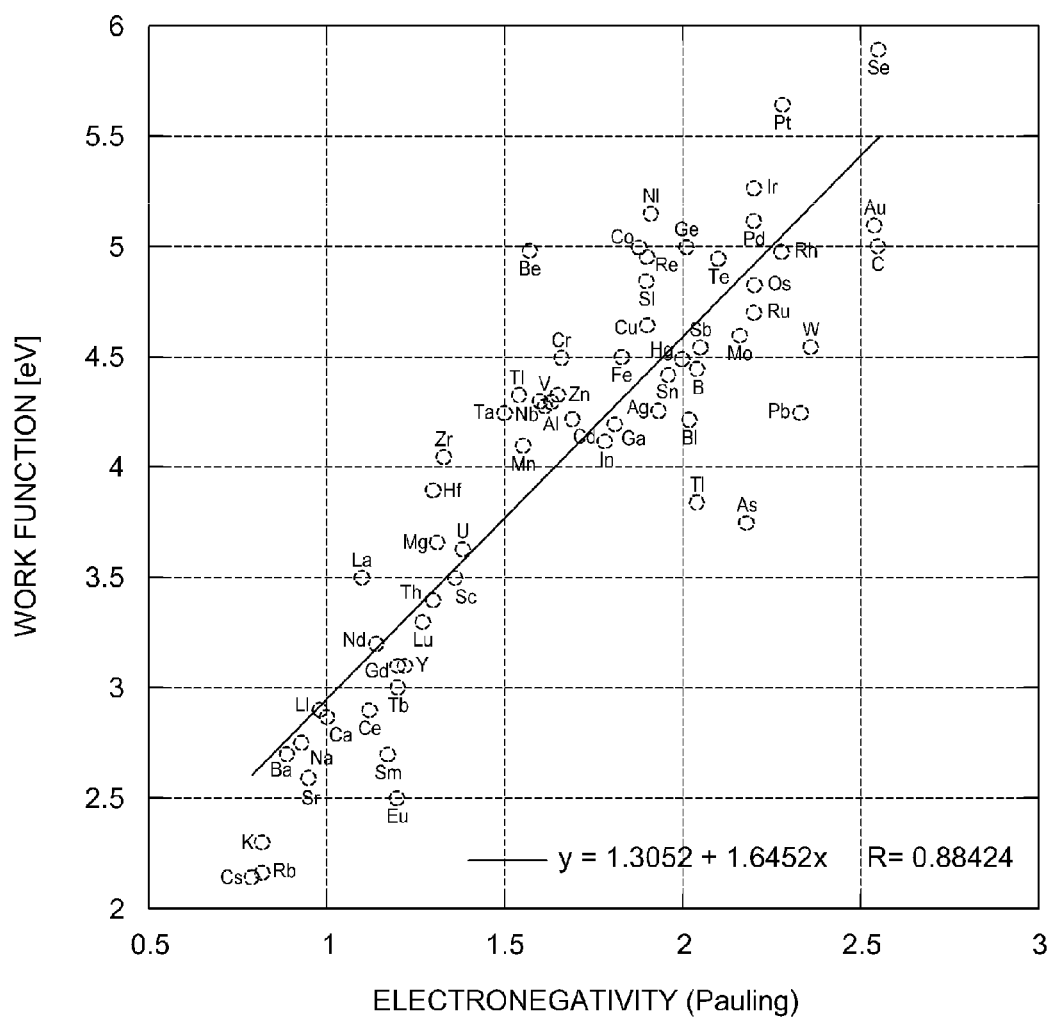
FIG. 1 is a graph illustrating a relation between an element, electronegativity and a work function.

As shown in FIG. 1 (cited from T. Kurihara, Report of graduation work, Kochi University of Technology, Japan, 2002), the work function is increased as the electronegativity of the element is increased, and the work function is reduced as the electronegativity of the element is reduced. One of causes that the TiN film has the high work function may be because the TiN film contains nitrogen (N) having high electronegativity of 3.04.

The inventors have diligently researched and devised a method of substituting some or all of N having high electronegativity with an element serving as a homologous element and having low electronegativity. It has been found that a conductive thin film having properties (characteristics) similar to that of the conductive thin film when the element other than the metal elements of the elements composing (constituting) the conductive thin film using the elements serving as a homologous element (a group 15) of N is only N can be formed, and the work function can be reduced and the work function can be modulated using the element having electronegativity lower than N. Elements serving as a homologous element of N and having electronegativity lower than N may be phosphorus (P), arsenic (As), antimony (Sb) and bismuth (Bi). A selection condition may be to select elements having electronegativity that can increase a difference from the electronegativity of the metal element that composes a film in which N is substituted. For example, P (electronegativity: 2.19) may be selected when N of the TiN film is substituted. It is supposed that a titanium phosphate film (a TiP film) is a conductive solid having a high melting point and has a work function lower than that of the TiN film.

As described above, the inventors have found that the value of the work function can be decreased and modulated while securing advantages of the TiN film by, for example, partially or entirely substituting N having high electronegativity of the TiN film with P serving as a homologous element and having low electronegativity. A titanium phosphate nitride film (a TiPN film) is formed by partially substituting N having high electronegativity of the TiN film with P serving as a homologous element and having low electronegativity. Detailed description thereof will be described below.

First Embodiment of the Present Invention

Hereinafter, a first embodiment of the present invention will be described with reference to FIGS. 2 and 3. A substrate processing apparatus 10 is configured as an example of an apparatus used in a substrate processing process serving as one process of a process of manufacturing a semiconductor device.

(1) Configuration of Processing Furnace

A heater 207 serving as a heating means (a heating mechanism or a heating system) is installed at a processing furnace 202. The heater 207 is formed in a cylindrical shape having a closed top.

A reaction pipe 203 that constitutes a reaction container (a processing container) in concentric with the heater 207 is disposed inside the heater 207. The reaction pipe 203 is formed of a heat-resistant material or the like (for example, quartz ($SiO_2$) or silicon carbide (SiC)), and formed in a cylindrical shape having a closed top and an open bottom.

A manifold 209 formed of a metal material such as stainless steel or the like is installed at a lower end of the reaction pipe 203. The manifold 209 is formed in a cylindrical shape, and a lower end opening thereof is air-tightly closed by a seal cap 219 serving as a lid formed of a metal material such as stainless steel or the like. O-rings 220 serving as seal members are installed between the reaction pipe 203 and the manifold 209 and between the manifold 209 and the seal cap 219, respectively. Mainly, a processing container is constituted by the reaction pipe 203, the manifold 209 and the seal cap 219, and a processing chamber 201 is formed in the processing container. The processing chamber 201 is configured to accommodate wafers 200 serving as substrates by a boat 217 (to be described below) in a state in which the wafers 200 are vertically arranged in a horizontal posture in a multi-stage.

A rotary mechanism 267 configured to rotate the boat 217 is installed at a side of the seal cap 219 opposite to the processing chamber 201. A rotary shaft 255 of the rotary mechanism 267 is connected to the boat 217 through the seal cap 219. The rotary mechanism 267 is configured to rotate the wafer 200 by rotating the boat 217. The seal cap 219 is configured to be vertically elevated by a boat elevator 115 serving as an elevation mechanism vertically installed outside the reaction pipe 203. The boat elevator 115 is configured to load/unload the boat 217 into/from the processing chamber 201 by elevating the seal cap 219. That is, the boat elevator 115 is configured as a conveyance apparatus (a conveyance mechanism) configured to convey the boat 217, i.e., the wafer 200 to the inside or the outside of the processing chamber 201.

The boat 217 serving as a substrate holder is configured such that a plurality of, for example, 25 to 200 wafers 200 are vertically arranged in a horizontal posture in concentric with each other in a multi-stage, i.e., at intervals. The boat 217 is formed of a heat-resistant material or the like (for example, quartz or SiC). Insulating plates 218 formed of a heat-resistant material or the like (for example, quartz or SiC) are supported at a lower section of the boat 217 in a horizontal posture and a multi-stage. Accordingly, heat from the heater 207 cannot be easily transferred to the seal cap 219 side. However, the embodiment is not limited to the above-mentioned description. For example, an insulating tube constituted by a cylindrical member formed of a heat-resistant material such as quartz or SiC may be installed under the boat 217, without installing the insulating plate 218. The heater 207 can heat the wafer 200 accommodated in the processing chamber 201 to a predetermined temperature.

Nozzles 410 and 420 are installed in the processing chamber 201 to pass through a sidewall of the manifold 209. Gas supply pipes 310 and 320 serving as gas supply lines are connected to the nozzles 410 and 420, respectively. In addition, a gas supply pipe 330 is connected to the gas supply pipe 320. As described, a plurality of kinds of gases (a processing gas, a source material) can be supplied into the processing chamber 201.

Mass flow controllers (MFCs) 312, 322 and 332 serving as flow rate controllers (flow rate control units) and valves 314, 324 and 334 serving as opening/closing valves are installed at the gas supply pipes 310, 320 and 330 in sequence from an upstream side, respectively. The nozzles 410 and 420 are connected to front end sections of the gas supply pipes 310 and 320, respectively. The nozzles 410 and 420 are configured as L-shaped long nozzles, and horizontal sections thereof are installed to pass through a sidewall of the manifold 209. Vertical sections of the nozzles 410 and 420 are installed to rise upward (upward in a stacking direction of the wafer 200) in an annular space between an inner wall of the reaction pipe 203 and the wafer 200 along the inner wall of the reaction pipe 203 (i.e., rise from one end side toward the other end side of a wafer arrangement region). That is, the nozzles 410 and 420 are installed at a region horizontally surrounding a wafer arrangement region beside a wafer arrangement region, in which the wafers 200 are arranged, along the wafer arrangement region.

Gas supply holes 410a and 420a configured to supply (eject) gases are installed at side surfaces of the nozzles 410 and 420, respectively. The gas supply holes 410a and 420a are opened toward a center of the reaction pipe 203. A plurality of gas supply holes 410a and 420a are installed from a lower section to an upper section of the reaction pipe 203 with the same opening area and at the same opening pitch.

As described above, a gas supply method of the embodiment includes conveying a gas via the nozzles 410 and 420 disposed in a vertically elongated space having an annular shape defined by the inner wall of the reaction pipe 203 and ends of the plurality of stacked wafers 200, i.e., a cylindrical space, and initially ejecting the gas into the reaction pipe 203 around the wafer 200 through the gas supply holes 410a and 420a opened in the nozzles 410 and 420 such that a main stream of the gas in the reaction pipe 203 is in a direction parallel to the surface of the wafer 200, i.e., the horizontal direction. As a result, since the gas can be uniformly supplied to the wafers 200, a film thickness of the thin film formed on the wafers 200 can be uniformized. In addition, while a gas flowing on the surfaces of the wafers 200, i.e., a gas remaining after reaction (a remaining gas) flows in a direction of an exhaust port, i.e., a direction of an exhaust pipe 231 (to be described below), the direction in which the remaining gas flows is appropriately specified according to a position of the exhaust port and is not limited to the vertical direction.

In addition, carrier gas supply pipes 510, 520 and 530 configured to supply a carrier gas are connected to the gas supply pipes 310, 320 and 330, respectively. MFCs 512, 522 and 532 and valves 514, 524 and 534 are installed at the carrier gas supply pipes 510, 520 and 530, respectively.

As an example of the above-mentioned configuration, a source gas serving as a processing gas is supplied into the processing chamber 201 through the gas supply pipe 310 via the MFC 312, the valve 314 and the nozzle 410. For example, a halogen-based source gas (a halogen-based source material, halide) is used as a source gas, and for example, titanium tetrachloride ($TiCl_4$) serving as a titanium-containing source material including titanium (Ti) that is a metal element as a first element is used. Ti is classified as a transition metal element. Halide is a compound including halogen that is a group 17 element, which may be fluoride including fluorine (F), chloride including chlorine (Cl), bromide including bromine (Br), iodide including iodine (I), or astatide including astatine (At). $TiCll_4$ is a chloride including Cl.

A first reactive gas that reacts with a source gas serving as a processing gas is supplied into the processing chamber 201 through the gas supply pipe 320 via the MFC 322, the valve 324 and the nozzle 420. For example, ammonia ($NH_3$) that is a nitrogen-containing gas including nitrogen (N) serving as a second element is used as the first reactive gas. $NH_3$ acts as a nitriding/reducing agent.

A second reactive gas that reacts with a source gas serving as a processing gas is supplied into the processing chamber 201 through the gas supply pipe 330 via the MFC 332, the valve 334, the gas supply pipe 320 and the nozzle 420. For example, phosphorus hydride (phosphine, $PH_3$) that is a P-containing gas including phosphorus (P) serving as the same ground element (a group 15 element) as the nitrogen (N) of the second element, which is a third element, is used as the second reactive gas. $PH_3$ also acts as additives (a doping agent).

For example, nitrogen ($N_2$) gas serving as an inert gas is supplied into the processing chamber 201 through the carrier gas supply pipes 510, 520 and 530 via the MFCs 512, 522 and 532, the valves 514, 524 and 534, and the nozzles 410 and 420.

Here, the source gas (the processing gas) disclosed herein is referred to as a source material in a gaseous state, for example, a gas obtained by vaporizing or sublimating a source material in a liquid state or a solid state under a normal temperature and a normal pressure, or source material in a gaseous state under a normal temperature and a normal pressure. In the specification, the case using "the source material" may be the case that means "a liquid source material in a liquid state," "a solid source material in a solid state," "a source gas in a gaseous state," or a composite thereof. Like $TiCl_4$ or the like, when a liquid source material in a liquid state under a normal temperature and a normal pressure or a solid source material in a solid state under a normal temperature or a normal pressure is used, the liquid source material or the solid source material is vaporized or sublimated by a system such as a vaporizer, a bubbler or a sublimation machine to be supplied as a source gas ($TiCl_4$ gas or the like).

When the processing gas flows through the gas supply pipes 310, 320 and 330 as described above, a processing gas supply system is constituted by the gas supply pipes 310, 320 and 330, the MFCs 312, 322 and 332, and the valves 314, 324 and 334. The nozzles 410 and 420 may be included in the processing gas supply system. The processing gas supply system may be simply referred to as a gas supply system.

When a halogen-based source gas serving as a processing gas flows through the gas supply pipe 310, a halogen-based source gas supply system is mainly constituted by the gas supply pipe 310, the MFC 312 and the valve 314. The nozzle 410 may be included in the halogen-based source gas supply system. When a titanium-containing gas (Ti source) flows as a halogen-based source gas, the halogen-based source gas supply system may be referred to as a titanium-containing gas supply system. The titanium-containing gas supply system may be referred to as a titanium-containing source material supply system, or may be simply referred to as a Ti source material supply system. When $TiCl_4$ gas flows through the gas supply pipe 310, the titanium-containing gas supply system may be referred to as a $TiCl_4$ gas supply system. The $TiCl_4$ gas supply system may be referred to as a $TiCl_4$ supply system.

When the first reactive gas and the second reactive gas serving as processing gases flow through the gas supply pipes 320 and 330, a reactive gas supply system is mainly constituted by the gas supply pipes 320 and 330, the MFCs 322 and 332, and the valves 324 and 334. The nozzle 420 may be included in the reactive gas supply system.

When the nitriding/reducing agent serving as the first reactive gas flows through the gas supply pipe 320, a nitriding/reducing agent supply system is mainly constituted by the gas supply pipe 320, the MFC 322 and the valve 324.

The nozzle 420 may be included in the nitriding/reducing agent supply system. When the nitrogen-containing gas (N source) flows as the nitriding/reducing agent, the nitriding/reducing agent supply system may be referred to as a nitrogen-containing gas supply system. When $NH_3$ gas flows through the gas supply pipe 320, the nitrogen-containing gas supply system may be referred to as an $NH_3$ gas supply system. The $NH_3$ gas supply system may be referred to as a $NH_3$ supply system.

When the phosphorus-containing gas serving as a second reactive gas flows through the gas supply pipe 330, a phosphorus-containing gas supply system is mainly constituted by the gas supply pipe 330, the MFC 332 and the valve 334. When $PH_3$ gas serving as the phosphorus-containing gas flows, the phosphorus-containing gas supply system may be referred to as a $PH_3$ gas supply system. The $PH_3$ gas supply system may be referred to as a $PH_3$ supply system.

In addition, a carrier gas supply system is mainly constituted by the carrier gas supply pipes 510, 520 and 530, the MFCs 512, 522 and 532, and the valves 514, 524 and 534. When an inert gas flows as the carrier gas, the carrier gas supply system may be referred to as an inert gas supply system. Since the inert gas also functions as a purge gas, the inert gas supply system may be referred to as a purge gas supply system.

The exhaust pipe 231 configured to exhaust atmosphere in the processing chamber 201 is installed at the manifold 209. The exhaust pipe 231 is installed to pass through the sidewall of the manifold 209 like the nozzles 410 and 420. As shown in FIG. 3, the exhaust pipe 231 is installed at a position opposite to the nozzles 410 and 420 via the wafer 200 when seen in a plan view. According to the above-mentioned configuration, the gas supplied to the vicinity of the wafer 200 in the processing chamber 201 through the gas supply holes 410a and 420a flows in a horizontal direction, i.e., a direction parallel to the surface of the wafer 200, and then, flows downward to be exhausted through the exhaust pipe 231. Like the above-mentioned description, a major stream of the gas in the processing chamber 201 becomes a flow in the horizontal direction.

A pressure sensor 245 serving as a pressure detector (a pressure detection unit) configured to detect a pressure in the processing chamber 201, an automatic pressure controller (APC) valve 243 serving as a pressure controller (a pressure control unit) configured to control a pressure in the processing chamber 201, and a vacuum pump 246 serving as a vacuum exhaust apparatus are connected the exhaust pipe 231 in sequence from an upstream side. The APC valve 243 is configured to perform vacuum exhaust or stoppage of the vacuum exhaust in the processing chamber 201 by opening/closing the valve in a state in which the vacuum pump 246 is operated, and adjust the pressure in the processing chamber 201 by adjusting an opening angle of the valve based on pressure information detected by the pressure sensor 245 in a state in which the vacuum pump 246 is operated. The APC valve 243 constitutes a portion of an exhaust flow path of an exhaust system, and functions not only as a pressure adjustment unit but also as an exhaust flow path opening/closing unit configured to close or seal the exhaust flow path of the exhaust system, i.e., an exhaust valve. In addition, a trap apparatus configured to trap byproducts, an unreacted source gas, or the like, in an exhaust gas, or a detox apparatus for detoxifying a corrosive element, a toxic element, or the like, included in the exhaust gas may be connected to the exhaust pipe 231. An exhaust system, i.e., an exhaust line is mainly constituted by the exhaust pipe 231, the APC valve 243 and the pressure sensor 245. In addition, the vacuum pump 246 may be included in the exhaust system. In addition, the trap apparatus or the detox apparatus may be included in the exhaust system.

A temperature sensor 263 serving as a temperature detector is installed in the reaction pipe 203, and a temperature in the processing chamber 201 becomes a desired temperature distribution by adjusting an amount of electricity to the heater 207 based on the temperature information detected by the temperature sensor 263. The temperature sensor 263 is formed in an L shape like the nozzles 410 and 420 and installed along the inner wall of the reaction pipe 203.

Figure 4:
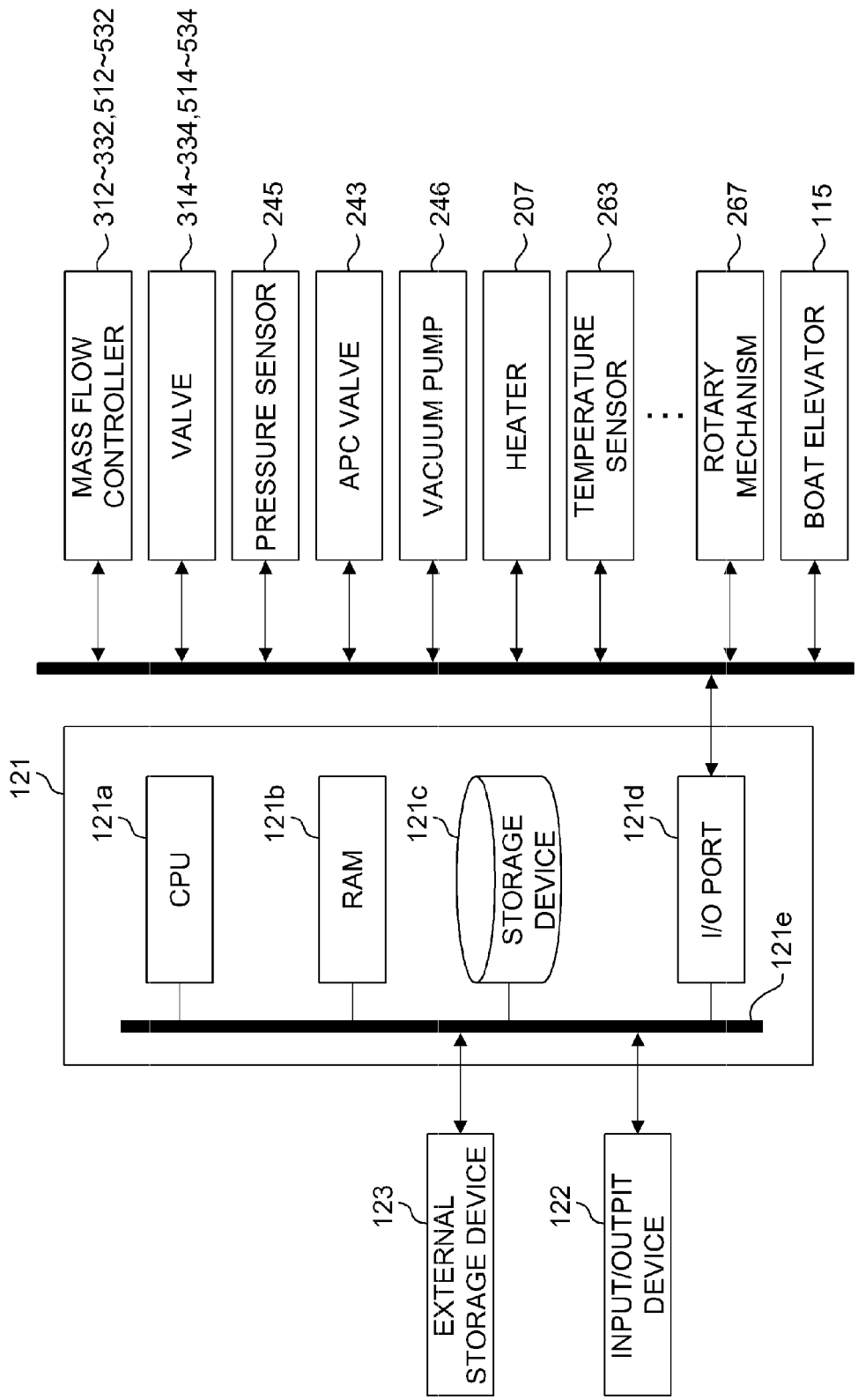
FIG. 4 is a block diagram illustrating a configuration of a controller included in the substrate processing apparatus shown in FIG. 1.

As shown in FIG. 4, a controller 121 serving as a control unit (a control means) is constituted by a computer including a central processing unit (CPU) 121a, a random access memory (RAM) 121b, a storage device 121c and an I/O port 121d. The RAM 121b, the storage device 121c and the I/O port 121d are configured to exchange data with the CPU 121a via an internal bus 121e. An input/output device 122 constituted by a touch panel or the like is connected to the controller 121.

The storage device 121c is constituted by a flash memory, a hard disk drive (HDD), or the like. A control program of controlling an operation of the substrate processing apparatus, a process recipe on which a sequence, a condition, or the like, of the substrate processing (to be described below) is written, or the like, is readably stored in the storage device 121c. The process recipe is combined to execute the sequence in the substrate processing process in the controller 121 to obtain a predetermined result, and functions as a program. Hereinafter, the process recipe, the control program, or the like, may be generally and simply referred to as a program. The case of using a term "program" in the specification may include the case in which a process recipe is solely included, a control program is solely included, or both of the process recipe and the control program are included. In addition, the RAM 121b is configured as a work area in which a program, data, or the like, read by the CPU 121a is temporarily held.

The I/O port 121d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotary mechanism 267, the boat elevator 115, and so on.

The CPU 121a is configured to read the process recipe from the storage device 121c according to input of a manipulation command from the input/output device 122 while reading and executing the control program from the storage device 121c. The CPU 121a is configured to control a flow rate adjustment operation of various gases by the MFCs 312, 322, 332, 512, 522 and 532 according to the read process recipe, an opening/closing operation of the valves 314, 324, 334, 514, 524 and 534, a pressure adjustment operation based on the opening/closing operation of the APC valve 243 and the pressure sensor 245 by the APC valve 243, a temperature adjustment operation of the heater 207 based on the temperature sensor 263, starting and stopping of the vacuum pump 246, a rotation and rotational speed adjustment operation of the boat 217 by the rotary mechanism 267, an elevation operation of the boat 217 by the boat elevator 115, and so on.

The controller 121 is not limited to a dedicated computer but may be constituted by a general-purpose computer. For example, the controller 121 of the embodiment may be configured by preparing an external storage device 123 in which the above-mentioned program is stored (for example, a magnetic tape, a magnetic disk such as a flexible disk, a hard disk or the like, an optical disc such as CD, DVD or the like, an optical magnetic disk such as MO, a semiconductor memory such as a USB memory, a memory card or the like), and installing the program in the general-purpose computer using the external storage device 123. However, a means configured to supply a program to a computer is not limited to the case in which the program is supplied via the external storage device 123. For example, the program may be supplied using a communication means such as the Internet, an exclusive line, or the like, without intervention of the external storage device 123. The storage device 121c or the external storage device 123 is constituted by a computer-readable recording medium. Hereinafter, these are generally and simply referred to as a recording medium. In addition, when the term "recording medium" is used herein, the recording medium may include solely the storage device 121c, solely the external storage device 123, or both of these.

(2) Substrate Processing Process

As a process of manufacturing a semiconductor device, a first embodiment of a process of forming a metal film that constitutes, for example, a gate electrode on a substrate will be described with reference to FIG. 5. The process of forming the metal film is performed using the processing furnace 202 of the substrate processing apparatus 10. In the following description, operations of parts that constitute the substrate processing apparatus 10 are controlled by the controller 121.

An exemplary film-forming sequence of the embodiment (simply referred to as a sequence) includes forming a film (for example, a TiPN film serving as a titanium-containing metal film) including a first element, a second element and a third element onto a wafer 200 by supplying a halogen-based source gas (for example, $TiCl_4$ gas) including the first element (for example, Ti), a first reactive gas (for example, $NH_3$ gas) including the second element (for example, N), and a second reactive gas (for example, $PH_3$ gas) including the third element (for example, P) serving as a homologous element of the second element onto the wafer 200 a predetermined number of times time-divisionally (asynchronously, intermittently or pulsewisely).

Preferably, a cycle including a process of supplying and exhausting the halogen-based source gas (for example, $TiCl_4$ gas) including the first element (for example, Ti) onto the wafer 200; a process of supplying (or supplying and exhausting) the first reactive gas (for example, $NH_3$ gas) including the second element (for example, N) onto the wafer 200; and a process of supplying and exhausting the second reactive gas (for example, $PH_3$ gas) including the third element (for example, P) serving as the homologous element of the second element onto the wafer 200 sequentially is performed a predetermined number of times (n times).

Figure 5:
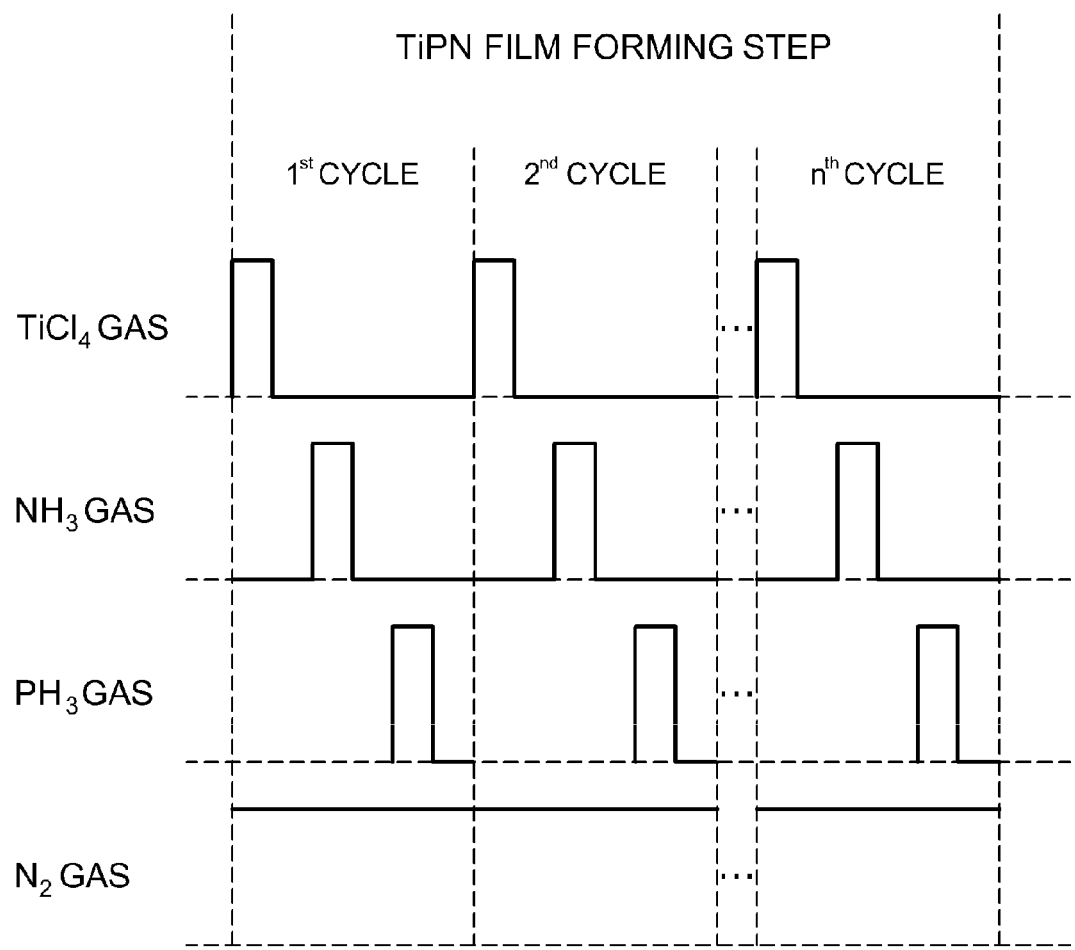
FIG. 5 illustrates a timing chart of a film-forming sequence in accordance with the first embodiment of the present invention.

Specifically, like the sequence shown in FIG. 5, a titanium phosphorus nitride film (a TiPN film) is formed by performing the cycle of time-divisionally flowing $TiCl_4$ gas, $NH_3$ gas and $PH_3$ gas in sequence a predetermined number of times (n times). The TiPN film may be referred to as a TiN film to which P is added (doped) or a TiN film (phosphorus-containing TiN film) including P. In addition, the sequence shown in FIG. 5 is represented as the following Equation 2 for the purpose of convenience. In addition, even in the following description, the same notations are used for the purpose of convenience.

$$(TiCl_4 \rightarrow NH_3 \rightarrow PH_3) \times n \Rightarrow TiPN \quad \text{[Equation 2]}$$

In the specification, the phrase "processing (or referred to as a process, a cycle, a step, or the like) is performed a predetermined number of times" means that the processing or the like is performed once or a plurality of number of times. That is, it means that the processing is performed one time or more. FIG. 5 shows an example in which each processing (cycle) is repeated by n cycles. The number of the processing or the like is appropriately selected according to a film thickness required in the TiPN film that is finally formed. That is, the number of the above-mentioned processing is determined according to the film thickness that is targeted.

In addition, the term "time-divisionally" described herein means that the processing is separated temporally. For example, in the specification, the phrase "the processing is performed time-divisionally" means that each processing is performed asynchronously, i.e., without synchronization. In other words, it means that each processing is performed in temporally separated pulses. That is, it means that the processing gases supplied in the processing are supplied not to be mixed with each other. When the processing is performed a plurality of number of times, the processing gases supplied in the processing are alternately supplied not to be mixed with each other.

In addition, when the term "wafer" is used herein, the wafer may include solely the wafer, or the wafer and a stacked body (a collected body) of predetermined layers, films, or the like, formed on the surface of the wafer, i.e., the wafer including the predetermined layers, films, or the like, formed on the surface. In addition, when the term "the surface of the wafer" is used herein, the surface of the wafer may include solely the surface (exposed surface) of the wafer, or a surface of a predetermined layer or film formed on the wafer, i.e., an outermost surface of the wafer as a stacked body.

Accordingly, when the phrase "a predetermined gas is supplied onto a wafer" is used herein, the phase may include "a predetermined gas is directly supplied onto a surface (exposed surface) of the wafer" or "a predetermined gas is supplied onto a layer or a film formed on the wafer, i.e., an outermost surface of the wafer as a stacked body." In addition, when the phrase "a predetermined layer (or film) is formed on a wafer" is used herein, the phrase may include "a predetermined layer (or film) is directly formed on a surface (exposed surface) of the wafer" or "a predetermined layer (or film) is formed on a layer or film formed on the wafer, i.e., an outermost surface of the wafer as a stacked body."

In addition, when the term "substrate" is used herein, the substrate may be used like when the term "wafer" is used, and in this case, the wafer may be substituted with the substrate.

In addition, the term "metal film" used herein means a film formed of a conductive material including a metal element (simply referred to as a conductive film), and includes a conductive metal nitride film, a conductive metal oxide film, a conductive metal oxynitride film, a conductive metal oxycarbide film, a conductive metal composite film, a conductive metal alloy film, a conductive metal silicide film, a conductive metal carbide film, a conductive metal carbonitride film, and so on. In addition, the TiPN film is a conductive metal nitride film.

(Wafer Charging and Boat Loading)

Figure 2:
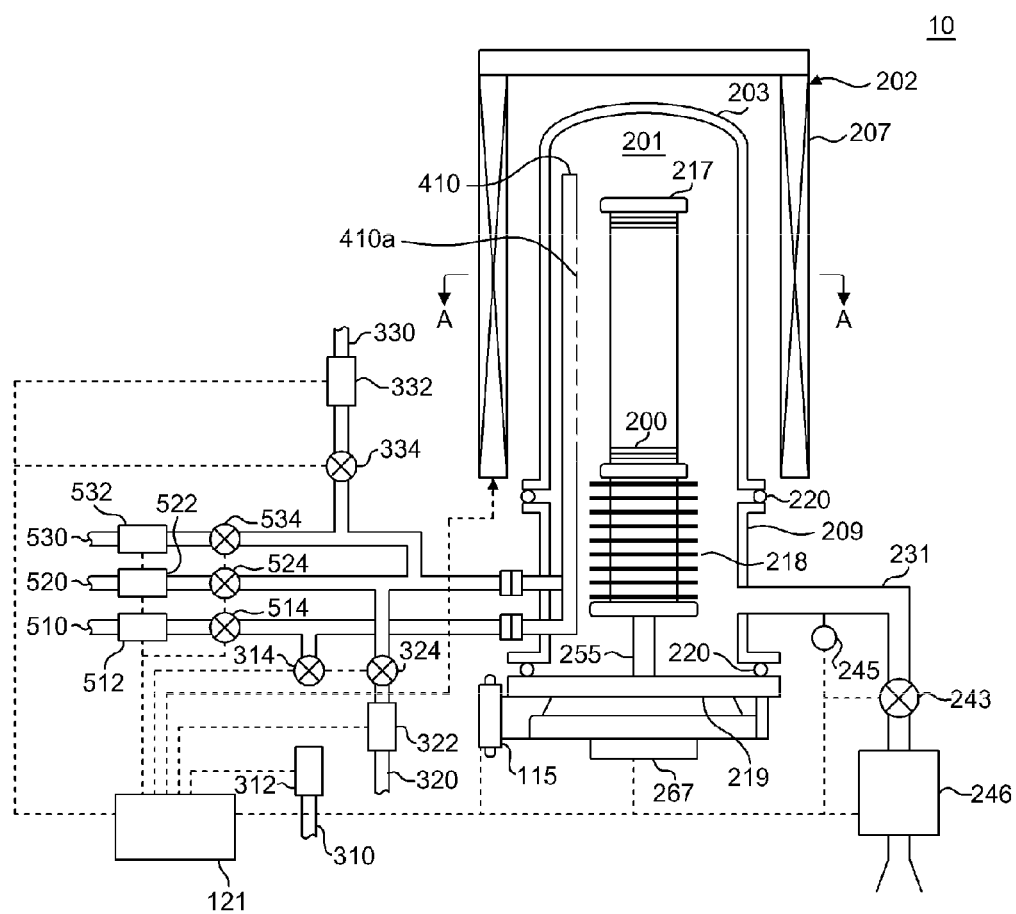
FIG. 2 schematically exemplifies a configuration of a processing furnace of a substrate processing apparatus used in a first embodiment of the present invention, wherein a longitudinal cross-sectional view of a portion of the processing furnace is shown.
Figure 3:
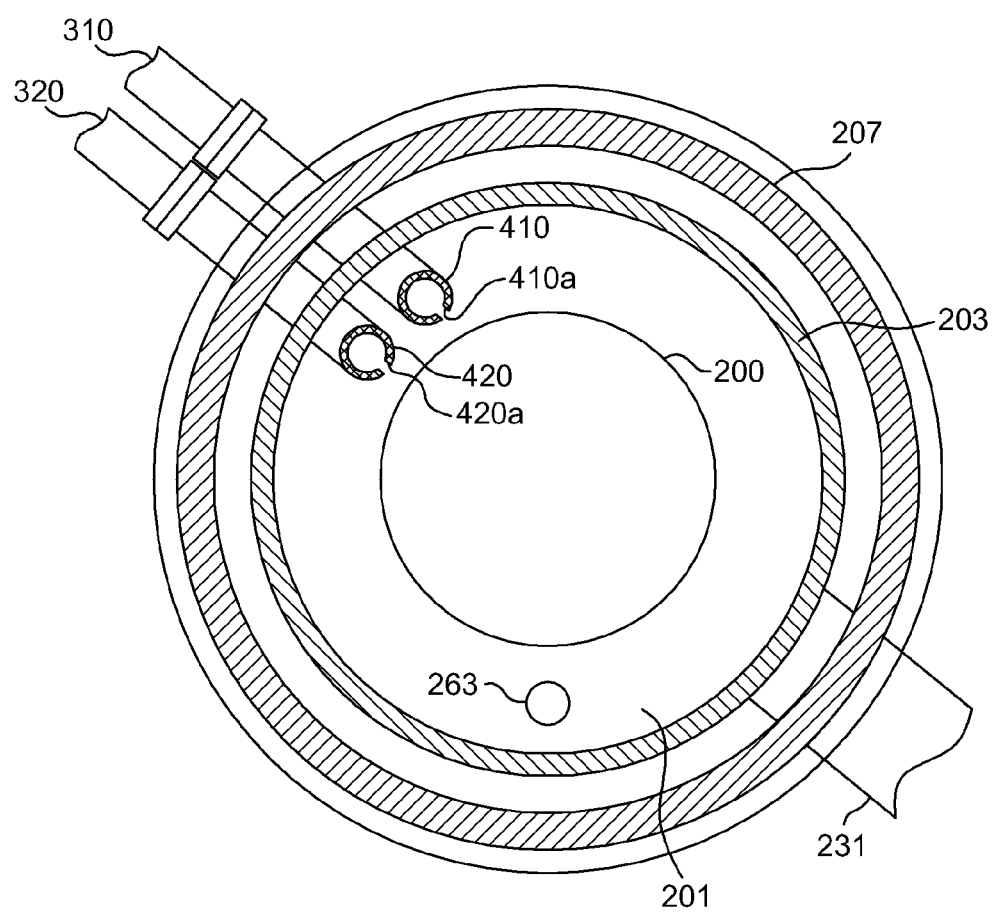
FIG. 3 is a cross-sectional view taken along line A-A of FIG. 1.

When a plurality of wafers 200 are charged into the boat 217, as shown in FIG. 2, the boat 217 that supports the plurality of wafers 200 is lifted by the boat elevator 115 to be loaded into the processing chamber 201 (boat loading). In this state, the seal cap 219 closes the lower end opening of the manifold 209 via the O-ring 220.

(Pressure Adjustment and Temperature Adjustment)

The inside of the processing chamber 201 is vacuum-exhausted by the vacuum pump 246 to a desired pressure (a degree of vacuum). Here, the pressure in the processing chamber 201 is measured by the pressure sensor 245, and the APC valve 243 is feedback-controlled based on the measured pressure information (pressure adjustment). The vacuum pump 246 maintains a normally operated state at least until the processing of the wafer 200 is completed. In addition, the wafer 200 in the processing chamber 201 is heated by the heater 207 to a desired temperature. Here, an amount of energization to the heater 207 is feedback-controlled based on the temperature information detected by the temperature sensor 263 such that the inside of the processing chamber 201 becomes a desired temperature distribution (temperature adjustment). In addition, the heating in the processing chamber 201 by the heater 207 is continuously performed at least until the processing of the wafer 200 is completed. Next, the boat 217 and the wafer 200 are started to be rotated by the rotary mechanism 267. In addition, the rotation of the boat 217 and the wafer 200 by the rotary mechanism 267 is continuously performed at least until the processing of the wafer 200 is completed.

(TiPN Film Forming Step)

Next, a step of forming the TiPN film will be described. The TiPN film forming step includes a $TiCl_4$ gas supply step, a remaining gas removing step, an $NH_3$ gas supply step, a remaining gas removing step, a $PH_3$ gas supply step and a remaining gas removing step, which will be described below.

($TiCl_4$ Gas Supply Step)

The valve 314 is opened and $TiCl_4$ gas flows into the gas supply pipe 310. A flow rate of the $TiCl_4$ gas flowing through the gas supply pipe 310 is adjusted by the MFC 312, and the $TiCl_4$ gas is supplied into the processing chamber 201 through the gas supply hole 410a of the nozzle 410 and exhausted through the exhaust pipe 231.

Here, the $TiCl_4$ gas is supplied onto the wafer 200. That is, the surface of the wafer 200 is exposed to the $TiCl_4$ gas. Here, the valve 514 is opened and $N_2$ gas flows into the carrier gas supply pipe 510 simultaneously. A flow rate of the $N_2$ gas flowing through the carrier gas supply pipe 510 is adjusted by the MFC 512, and the $N_2$ gas is supplied into the processing chamber 201 and exhausted through the exhaust pipe 231 together with the $TiCl_4$ gas. Here, in order to prevent intrusion of the $TiCl_4$ gas into the nozzle 420, the valves 524 and 534 are opened and the $N_2$ gas flows through the carrier gas supply pipes 520 and 530. The $N_2$ gas is supplied into the processing chamber 201 and exhausted through the exhaust pipe 231 via the gas supply pipes 320 and 330 and the nozzle 420. In addition, the $N_2$ gas may flow through any one of the carrier gas supply pipes 520 and 530 by opening any one of the valves 524 and 534.

The pressure of the processing chamber 201 becomes, for example, a range of 1 Pa to 70,000 Pa, preferably 1 Pa to 1,333 Pa, for example, 20 Pa to 50 Pa as the APC valve 243 is appropriately adjusted. A supply flow rate of the $TiCl_4$ gas controlled by the MFC 312 is for example, 0.05 slm to 2 slm, preferably 0.15 slm to 1 slm, for example, 0.45 slm. A supply flow rate of the $N_2$ gas controlled by the MFCs 512, 522 and 532 is, for example, 1 slm to 20 slm, preferably 5 slm to 15 slm, for example, 7 slm. A time of supplying the $TiCl_4$ gas onto the wafer 200, i.e., a gas supply time (an radiation time) is, for example, 0.01 to 60 seconds, preferably, 1 to 30 seconds, for example, 3 seconds. Here, the temperature of the heater 207 is a temperature such that the temperature of the wafer 200 becomes a temperature range of, for example, 250° C. to 600° C., preferably 300° C. to 550° C., for example 380° C. When the temperature is 600° C. or more, the film may be affected by a thermal budget, and when the temperature is 250° C. or less, a large amount of impurities may occur and the impurities may be intruded into the film. The gases flowing through the processing chamber 201 are only $TiCl_4$ gas and $N_2$ gas, and for example, a titanium-containing layer having a thickness of about less than 1 atomic layer to several atomic layers is formed on an outermost surface of the wafer 200 (a base film) by supply of the $TiCl_4$ gas.

The titanium-containing layer may be a Ti layer, a Ti layer including Cl, an adsorption layer of TiCl4, or a composite layer including at least two of these.

The Ti layer includes a discontinuous layer in addition to a continuous layer constituted by Ti. That is, the Ti layer includes a Ti accumulation layer having a thickness of about less than 1 atomic layer to several atomic layers constituted by Ti.

The Ti layer including Cl is a general name that also includes a discontinuous layer, in addition to a continuous layer constituted by Ti and including Cl, or a Ti thin film including Cl and obtained by overlapping the layers. The continuous layer constituted by Ti and including Cl may be referred to as the Ti thin film. Ti that constitutes the Ti layer including Cl includes Ti from which bonding to Cl is completely separated, in addition to Ti from which boding to Cl is not completely separated.

The adsorption layer of $TiCl_4$ includes a discontinuous adsorption layer in addition to a continuous adsorption layer constituted by $TiCl_4$ molecules. That is, the adsorption layer of $TiCl_4$ includes an adsorption layer having a thickness of 1 molecular layer or less than 1 molecular layer constituted by $TiCl_4$ molecules. The $TiCl_4$ molecules that constitute the adsorption layer of $TiCl_4$ include molecules from which bonding of Ti and Cl is partially separated. That is, the adsorption layer of $TiCl_4$ may be a physical adsorption layer of $TiCl_4$ or a chemical adsorption layer of $TiCl_4$, or may include both of these.

Here, the layer having a thickness of less than 1 atomic layer is an atomic layer that is discontinuously formed, and the layer having a thickness of 1 atomic layer is an atomic layer that is continuously formed. The layer having a thickness of less than 1 molecular layer is a molecular layer that is discontinuously formed, and the layer having a thickness of 1 molecular layer is a molecular layer that is continuously formed. The titanium-containing layer including Cl may include both of the Ti layer including Cl and the adsorption layer of $TiCl_4$. However, the titanium-containing layer including Cl is represented using expressions of "1 atomic layer," "several atomic layers," or the like.

(Remaining Gas Removing Step)

After the titanium-containing layer is formed, the valve 314 is closed to stop supply of the $TiCl_4$ gas. Here, the APC valve 243 is opened, and the inside of the processing chamber 201 is vacuum-exhausted by the vacuum pump 246 to discharge the unreacted $TiCl_4$ gas remaining in the processing chamber 201 or the $TiCl_4$ gas after contribution to formation of the titanium-containing layer from the processing chamber 201. That is, the unreacted $TiCl_4$ gas remaining in a space in which the wafer 200 on which the titanium-containing layer is formed is provided or the $TiCl_4$ gas after contribution to formation of the titanium-containing layer is removed. Here, the valves 514, 524 and 534 are opened to maintain the supply of the $N_2$ gas into the processing chamber 201. The N$_2$ gas acts as a purge gas to improve an effect of discharging the unreacted TiCl$_4$ gas remaining in the processing chamber 201 or the TiCl$_4$ gas after contribution to formation of the titanium-containing layer from the processing chamber 201.

Here, the gas remaining in the processing chamber 201 may not be completely discharged, or the inside of the processing chamber 201 may not be completely purged. When the gas remaining in the processing chamber 201 is slight, there is no bad influence occurring in the following step. A flow rate of the N$_2$ gas supplied into the processing chamber 201 may not be a large flow rate, and for example, the N$_2$ gas can be supplied to an amount similar to a volume of the reaction pipe 203 (the processing chamber 201) to perform the purge such that no bad influence occurs in the following step. As described above, as the inside of the processing chamber 201 is not completely purged, a purge time can be reduced to improve throughput. In addition, consumption of the N$_2$ gas can be suppressed to a minimum necessity level.

(NH$_3$ Gas Supply Step)

After the remaining gas in the processing chamber 201 is removed, the valve 324 is opened and NH$_3$ gas flows through the gas supply pipe 320. A flow rate of the NH$_3$ gas flowing through the gas supply pipe 320 is adjusted by the MFC 322, and the NH$_3$ gas is supplied into the processing chamber 201 through the gas supply hole 420a of the nozzle 420 to be exhausted through the exhaust pipe 231. Here, the NH$_3$ gas is supplied onto the wafer 200. That is, the surface of the wafer 200 is exposed to the NH$_3$ gas. Here, the valve 524 is opened and the N$_2$ gas flows through the carrier gas supply pipe 520 simultaneously. A flow rate of the N$_2$ gas flowing through the carrier gas supply pipe 520 is adjusted by the MFC 522, and the N$_2$ gas is supplied into the processing chamber 201 to be exhausted through the exhaust pipe 231 together with the NH$_3$ gas. Here, in order to prevent intrusion of the NH$_3$ gas into the nozzle 410 and the gas supply pipe 330, the valves 514 and 534 are opened and the N$_2$ gas flows through the carrier gas supply pipes 510 and 530. The N$_2$ gas is supplied into the processing chamber 201 via the gas supply pipes 310, 330 and 320 and the nozzles 410 and 420 to be exhausted through the exhaust pipe 231.

When the NH$_3$ gas flows, the APC valve 243 is appropriately adjusted to regulate the pressure in the processing chamber 201 to, for example, 1 Pa to 70,000 Pa, preferably 1 Pa to 1,330 Pa, for example, 50 Pa to 100 Pa. A supply flow rate of the NH$_3$ gas controlled by the MFC 322 is, for example, 1 slm to 20 slm, preferably 1 slm to 10 slm, for example, 7.5 slm. The supply flow rate of the NH$_3$ gas is appropriately varied according to a concentration of phosphorus (P) introduced into the layer during the next PH$_3$ gas supply step. One of determination factors of the concentration of the phosphorus (P) may be an amount of an adsorption site remaining on the surface of the wafer 200. A larger amount of P can be introduced as the amount of the adsorption site is increased. That is, since the amount of the adsorption site remaining after a substitution reaction of the NH$_3$ gas is determined according to the amount of the NH$_3$ gas that performs the substitution reaction with the titanium-containing layer, the supply flow rate of the NH$_3$ gas is one of the parameters of the P concentration. The supply flow rate of the N$_2$ gas controlled by the MFCs 512, 522 and 532 is, for example, 1 slm to 20 slm, preferably 5 slm to 15 slm, for example, 7 slm. A time of supplying the NH$_3$ gas onto the wafer 200, i.e., a gas supply time (a radiation time) is, for example, 0.01 to 300 seconds, preferably 1 to 60 seconds, for example, 15 seconds. Here, the temperature of the heater 207 is set to the temperature like the TiCl$_4$ gas supply step.

Here, the gases flowing through the processing chamber 201 are only the NH$_3$ gas and the N$_2$ gas. The NH$_3$ gas is substituted with a portion of the titanium-containing layer (the absorption site of the titanium-containing layer) formed on the wafer 200 in the TiCl$_4$ gas supply step. Accordingly, the layer including Ti and N (hereinafter, simply referred to as the TiN layer) is formed on the wafer 200. Both of the TiN layer and the adsorption site in which no substitution with the titanium-containing layer occurs are provided on the wafer 200.

(Remaining Gas Removing Step)

When the TiN layer is formed, the valve 324 is closed to stop the supply of the NH$_3$ gas. Here, the APC valve 243 is opened, and the inside of the processing chamber 201 is vacuum-exhausted by the vacuum pump 246 to discharge the unreacted NH$_3$ gas remaining in the processing chamber 201, the NH$_3$ gas after contribution to formation of the TiN layer, or byproducts from the processing chamber 201. That is, the unreacted NH$_3$ gas remaining in the space in which the wafer 200 on which the TiN layer is formed is provided or the NH$_3$ gas after contribution to formation of the TiN layer is removed. Here, the valves 514, 524 and 534 are opened to maintain the supply of the N$_2$ gas into the processing chamber 201. The N$_2$ gas acts as a purge gas, and thus, an effect of discharging the unreacted NH$_3$ gas remaining in the processing chamber 201, the NH$_3$ gas after contribution to formation of the TiN layer, or byproducts from the processing chamber 201 can be increased.

Here, like the remaining gas removing step after the TiCl$_4$ gas supply step, the gas remaining in the processing chamber 201 may not be completely discharged, or the inside of the processing chamber 201 may not be completely purged.

(PH$_3$ Gas Supply Step)

After the remaining gas in the processing chamber 201 is removed, the valve 334 is opened and the PH$_3$ gas flows through the gas supply pipe 330. A flow rate of the PH$_3$ gas flowing through the gas supply pipe 330 is adjusted by the MFC 332, and the PH$_3$ gas flows through the gas supply pipe 320 to be supplied into the processing chamber 201 through the gas supply hole 420a of the nozzle 420 to be exhausted through the exhaust pipe 231. Here, the PH$_3$ gas is supplied onto the wafer 200. That is, the surface of the wafer 200 is exposed to the PH$_3$ gas. Here, the valve 534 is opened and the N$_2$ gas flows through the carrier gas supply pipe 530 simultaneously. A flow rate of the N$_2$ gas flowing through the carrier gas supply pipe 530 is adjusted by the MFC 532, and the N$_2$ gas is supplied into the processing chamber 201 to be exhausted through the exhaust pipe 231 together with the PH$_3$ gas. Here, in order to prevent intrusion of the PH$_3$ gas into the nozzle 410 and the gas supply pipes 310 and 320, the valves 514 and 524 are opened and the N$_2$ gas flows through the carrier gas supply pipes 510 and 520. The N$_2$ gas is supplied into the processing chamber 201 via the gas supply pipes 310 and 320 and the nozzles 410 and 420 to be exhausted through the exhaust pipe 231.

When the PH$_3$ gas flows, the APC valve 243 is appropriately adjusted, and the pressure in the processing chamber 201 is, for example, 1 Pa to 70,000 Pa, preferably 1 Pa to 1,330 Pa, for example 50 Pa to 100 Pa. In addition, the number of collision of the PH$_3$ gas with the wafer 200 can be increased or decreased by controlling a pressure (a partial pressure) of the PH$_3$ gas, and reactivity can be controlled because a decomposition level of the PH$_3$ gas can be controlled. For example, since the number of collisions of the PH$_3$ gas with the wafer 200 can be increased when the pressure of the PH$_3$ gas is increased, decomposition of the PH$_3$ gas is further performed to increase reactivity. Accordingly, a reaction of the titanium-containing layer with the adsorption site can be accelerated even at the same gas supply time.

The supply flow rate of the PH$_3$ gas controlled by the MFC 332 is, for example, 1 slm to 20 slm, preferably 1 slm to 10 slm, for example, 7.5 slm. The supply flow rate of the N$_2$ gas controlled by the MFCs 512, 522 and 532 is, for example, 1 slm to 20 slm, preferably 5 slm to 15 slm, for example, 7 slm. A time of supplying the PH$_3$ gas onto the wafer 200, i.e., a gas supply time (a radiation time) is, for example, 0.01 to 300 seconds, preferably 1 to 60 seconds, for example, 15 seconds. A supply concentration of the PH$_3$ gas is, for example, 0.5% to 10%, preferably 1% to 5%, for example, 1%. Excessive autolysis of the PH$_3$ gas can be suppressed as the concentration is 10% or less, and lack of adsorption of the PH$_3$ gas to the wafer 200 can be suppressed as the concentration is 0.5% or more. Here, the temperature of the heater 207 is set to the same temperature as in the TiCl$_4$ gas supply step.

Here, the gases flowing through the processing chamber 201 are only the PH$_3$ gas and the N$_2$ gas. The PH$_3$ gas is substituted with at least a portion of the adsorption site of the titanium-containing layer formed in the TiCl$_4$ gas supply step. Here, the PH$_3$ gas may also be substituted with the TiN layer formed on the wafer 200 in the NH$_3$ gas supply step. Accordingly, the layer including Ti, N and P having a predetermined composition ratio (hereinafter, simply referred to as a TiPN layer) is formed on the wafer 200. In addition, the TiPN layer may include the remaining Cl or the like as impurities.

(Remaining Gas Removing Step)

After the TiPN layer is formed, the valve 334 is closed to stop the supply of the PH$_3$ gas. Here, the APC valve 243 is opened, and the inside of the processing chamber 201 is vacuum-exhausted by the vacuum pump 246 to discharge the unreacted PH$_3$ gas remaining in the processing chamber 201 or the PH$_3$ gas after contribution to formation of the TiPN layer is removed from the processing chamber 201. That is, the unreacted PH$_3$ gas remaining in the space in which the wafer 200 on which the TiPN layer is formed is provided, the PH$_3$ gas after contribution to formation of the TiPN layer, or byproducts are removed. Here, the valves 514, 524 and 534 are opened to maintain the supply of the N$_2$ gas into the processing chamber 201. The N$_2$ gas acts as a purge gas, and thus, an effect of discharging the unreacted PH$_3$ gas remaining in the processing chamber 201, the PH$_3$ gas after contribution to formation of the TiPN layer, or byproducts from the processing chamber 201 can be improved.

Here, like the remaining gas removing step after the TiCl$_4$ gas supply step, the gas remaining in the processing chamber 201 may not be completely discharged, or the inside of processing chamber 201 may not be completely purged.

(Performed Predetermined Number of Times)

The TiPN film having a predetermined thickness (for example, 0.1 nm to 10 nm) is formed on the wafer 200 by performing a cycle one time or more (a predetermined number of times), the cycle including the TiCl$_4$ gas supply step, the remaining gas removing step, the NH$_3$ gas supply step, the remaining gas removing step, the PH$_3$ gas supply step and the remaining gas removing step, which are sequentially performed, i.e., setting the processing of the TiCl$_4$ gas supply step, the remaining gas removing step, the NH$_3$ gas supply step, the remaining gas removing step, the PH$_3$ gas supply step and the remaining gas removing step as one cycle, and performing the processing by n cycles (n is an integer of 1 or more). The cycle may be repeated a plurality of times.

(Purge and Return to Atmospheric Pressure)

After the TiPN film having a predetermined film thickness is formed, the valves 514, 524 and 534 are opened, and the N$_2$ gas is supplied into the processing chamber 201 through the gas supply pipes 510, 520 and 530 to be exhausted through the exhaust pipe 231. The N$_2$ gas acts as a purge gas, and thus, the inside of the processing chamber 201 is purged by the inert gas to remove the gas or byproducts remaining in the processing chamber 201 from the processing chamber 201 (purge). Next, the atmosphere in the processing chamber 201 is substituted with the inert gas (inert gas substitution), and the pressure in the processing chamber 201 is returned to a normal pressure (return to the atmospheric pressure).

(Boat Unloading and Wafer Discharging)

The seal cap 219 is lowered by the boat elevator 115 to open the lower end of the manifold 209. Then, the processed wafer 200 supported by the boat 217 is unloaded to the outside of the processing chamber 201 from the lower end of the manifold 209 (boat unloading). The processed wafer 200 is discharged from the boat 217 (wafer discharging).

In addition, while the example of performing the remaining gas removing step between the NH$_3$ gas supply step and the PH$_3$ gas supply step has been described, since the NH$_3$ gas and the PH$_3$ gas do not remarkably react with each other, the PH$_3$ gas may be supplied by opening the valve 334 immediately after closing the valve 324 and stopping the supply of the NH$_3$ gas, without performing the remaining gas removing step. Since a time consumed for the processing can be reduced by omitting the remaining gas removing step, throughput can be improved.

(3) Effects by the Embodiment

According to the embodiment, one or a plurality of effects described below can be obtained.

In the embodiment, when the TiPN film is formed using the nitrogen-containing gas and the phosphorus-containing gas including P that is a homologous element of N and includes P having lower electronegativity than N, a cycle of supply of the TiCl$_4$ gas→removal of the remaining gas→supply of the NH$_3$ gas→(removal of the remaining gas→) supply of the PH$_3$ gas→removal of the remaining gas is set as 1 cycle and the cycle is performed a predetermined number of times to form the TiPN film, and thus, the following effects can be obtained.

(1) Since P that is a homologous element (a group 15, i.e., a group V) of N is used, a conductive thin film having properties (characteristics) similar to a conductive thin film when an element except for a metal element is only N among elements that compose (constitute) the conductive thin film can be formed.

(2) Since P having lower electronegativity than N is used, the TiPN film having a lower work function than the TiN film can be formed.

(3) Since the TiPN film serving as a metal film is formed using two elements of N and P, a work function of the TiPN film can be tuned by controlling a concentration of P (or a concentration of N)

(4) Since the NH$_3$ gas flows first before the PH$_3$ gas after formation of the titanium-containing layer, an amount (the concentration of P) introduced into the TiPN film can be adjusted according to the exposure amount of the NH$_3$ gas, and thus, the work function of the TiPN film can be tuned.

Second Embodiment of the Present Invention

Figure 6:
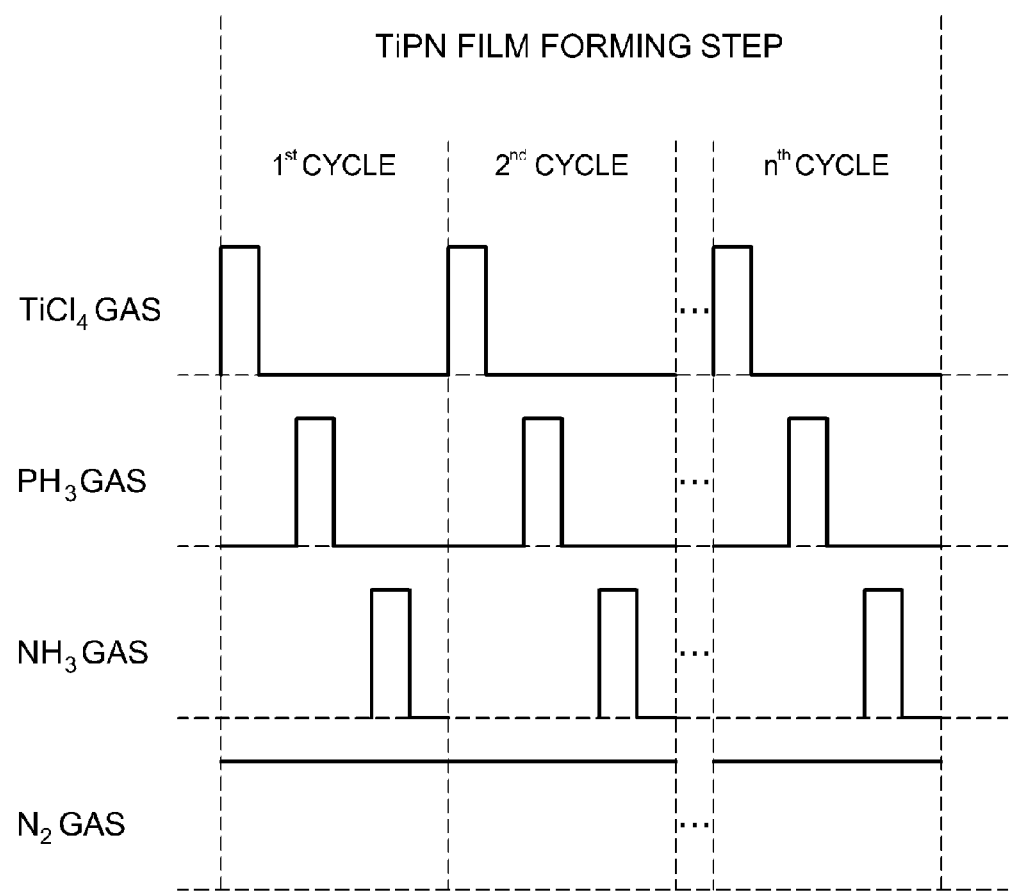
FIG. 6 illustrates a timing chart of a film-forming sequence in accordance with a second embodiment of the present invention.

In the embodiment, the TiPN film is formed by reversing a supply sequence of the NH$_3$ gas and the PH$_3$ gas of the first embodiment, and supplying gases in sequence of TiCl$_4$ gas, PH$_3$ gas and NH$_3$ gas time-divisionally a predetermined number of times (n times) as shown in FIG. 6 and Equation 3.

$$(TiCl_4 \rightarrow PH_3 \rightarrow NH_3) \times n \Rightarrow TiPN \qquad [\text{Equation 3}]$$

That is, the TiPN film is formed by performing a cycle one time or more (a predetermined number of times), the cycle including the TiCl$_4$ gas supply step, the remaining gas removing step, the PH$_3$ gas supply step, the remaining gas removing step, the NH$_3$ gas supply step and the remaining gas removing step, which are sequentially performed time-divisionally in the TiPN film forming step, i.e., setting the processing of the TiCl$_4$ gas supply step, the remaining gas removing step, the PH$_3$ gas supply step, the remaining gas removing step, the NH$_3$ gas supply step and the remaining gas removing step as 1 cycle, and performing the processing n cycles (n is an integer of 1 or more). Since a processing sequence and a processing condition of each step are substantially similar to the first embodiment, detailed description thereof will be omitted. In addition, the remaining gas removing step between the PH$_3$ gas supply step and the NH$_3$ gas supply step can also be omitted due to the same reason as the first embodiment, and thus, the same effect as in the first embodiment can be obtained. In addition, since the PH$_3$ gas flows first before the NH$_3$ gas after formation of the titanium-containing layer, the amount of P (the P concentration of the TiPN film) introduced into the TiPN film using an exposure amount (a supply flow rate) of the PH$_3$ gas as a major parameter can be adjusted. For example, when the exposure amount of the PH$_3$ gas is increased, the P concentration of the TiPN film can be increased. That is, the P concentration of the TiPN film can be controlled (adjusted) by adjusting (controlling) the exposure amount of the PH$_3$ gas.

Preferably, when a film (for example, a TiPN film) including a first element (for example, Ti), a second element (for example, N) and a third element (for example, P) is formed on the wafer 200, a cycle sequentially including a process of supplying and exhausting a halogen-based source gas (for example, TiCl$_4$ gas) including the first element onto the wafer 200; a process of supplying and exhausting a second reactive gas (for example, PH$_3$ gas) including the third element that is a homologous element of the second element onto the wafer 200; and a process of supplying (or supplying and exhausting) a first reactive gas (for example, NH$_3$ gas) including the second element onto the wafer 200 is performed a predetermined number of times (n times).

The following effects can be obtained in the embodiment.

(1) Since P that is a homologous element (a group 15) of N is used, a conductive thin film having properties (characteristics) similar to a conductive thin film when an element except for a metal element is only N among elements that compose (constitute) the conductive thin film can be formed.

(2) Since P having lower electronegativity than N is used, the TiPN film having a lower work function than the TiN film can be formed.

(3) Since the TiPN film serving as a metal film is formed using two elements of N and P, the work function of the TiPN film can be tuned by controlling the P concentration (or the N concentration).

(4) Since the PH$_3$ gas flows first before the NH$_3$ gas after formation of the titanium-containing layer, the amount of P (the P concentration of the TiPN film) introduced into the TiPN film can be adjusted according to the exposure amount of the PH$_3$ gas (i.e., using the exposure amount of the PH$_3$ gas as a major parameter). That is, the work function of the TiPN film can be tuned.

Third Embodiment of the Present Invention

Figure 7:
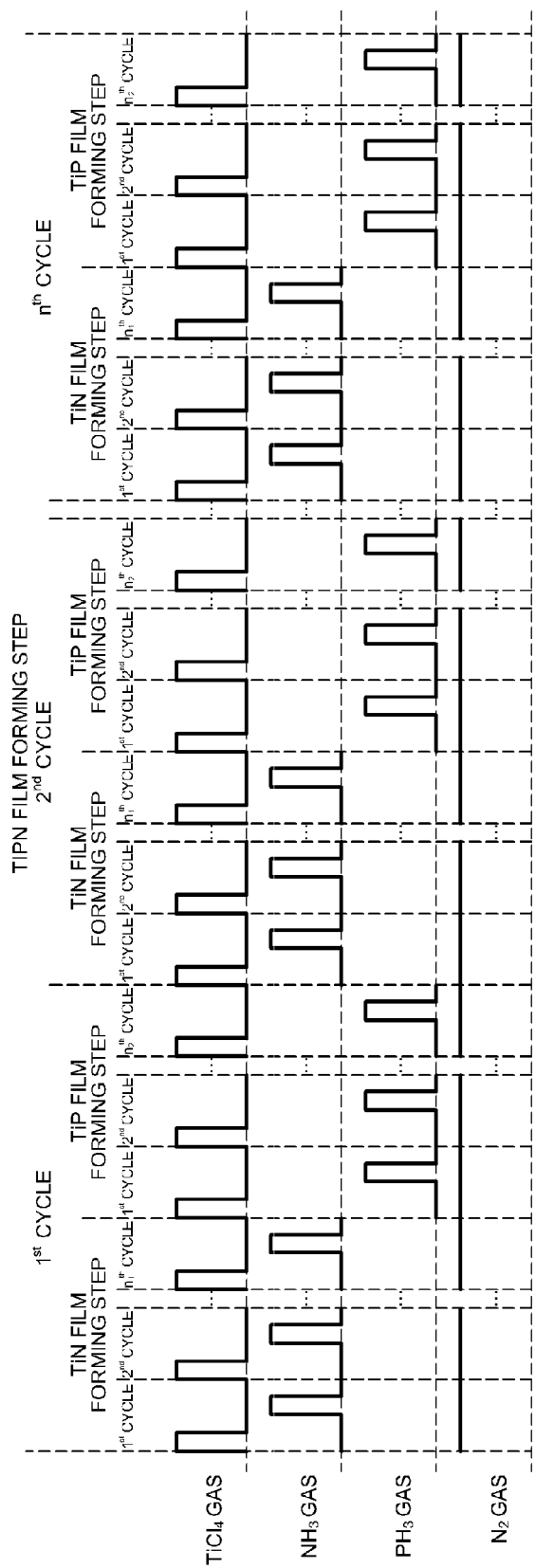
FIG. 7 illustrates a timing chart of a film-forming sequence in accordance with a third embodiment of the present invention.

In the embodiment, as shown in FIG. 7 and Equation 4, first, a TiN film is formed by setting processing of time-divisionally supplying TiCl$_4$ gas and NH$_3$ gas one time each as 1 cycle (a first cycle) and performing the first cycle a predetermined number of times ($n_1$ times), then, a TiP film is formed by setting processing of time-divisionally supplying TiCl$_4$ gas and PH$_3$ gas one time each as 1 cycle (a second cycle) and performing the second cycle a predetermined number of times ($n_2$ times), and a TiPN film is formed by setting formation (the first cycle) of the TiN film and formation (the second cycle) of the TiP film as 1 cycle and performing the cycle a predetermined number of times ($n_3$ times). Detailed description of the parts similar to the first embodiment will be omitted, and different parts from the first embodiment will be described below.

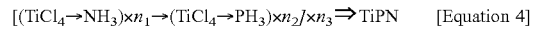

$$[(TiCl_4 \rightarrow NH_3) \times n_1 \rightarrow (TiCl_4 \rightarrow PH_3) \times n_2] \times n_3 \Rightarrow TiPN \qquad [\text{Equation 4}]$$

In an exemplary sequence of the embodiment, a film (for example, TiN film) including Ti and N is formed by performing a first cycle a predetermined number of times ($n_1$ times), the first cycle including sequentially a process of supplying and exhausting a halogen-based source gas (for example, TiCl$_4$ gas) including a first element (for example, Ti) onto the wafer 200 and a process of supplying (or supplying and exhausting) a first reactive gas (for example, NH$_3$ gas) including a second element (for example, N) onto the wafer 200. Then, a film (for example, TiP film) including Ti and P is formed by performing a second cycle a plurality of number of times ($n_2$ times), the second cycle including sequentially a process of supplying and exhausting a halogen-based source gas (for example, TiCl$_4$ gas) including a first element (for example, Ti) onto the wafer 200 and a process of supplying and exhausting a second reactive gas (for example, PH$_3$ gas) including a third element (for example, P) that is a homologous element of the second element onto the wafer 200. A film (for example, TiPN film) including Ti, N and P is formed on the wafer 200 by performing the first cycle and the second cycle sequentially a predetermined number of times ($n_3$ times).

In the embodiment, the TiPN film is formed by performing the TiN film forming step and the TiP film forming step in the TiPN film forming step a predetermined number of times ($n_3$ times). The TiN film is formed by performing 1 cycle (the first cycle) a predetermined number of times ($n_1$ times), the first cycle including the TiCl$_4$ gas supply step, the remaining gas removing step, the NH$_3$ gas supply step and the remaining gas removing step that are sequentially performed in the TiN film forming step. The TiP film is formed by performing 1 cycle (the second cycle) a predetermined number of times ($n_2$ times), the second cycle including the TiCl$_4$ gas supply step, the remaining gas removing step, the PH$_3$ gas supply step and the remaining gas removing step that are sequentially performed in the TiP film forming step. A processing sequence and a processing condition of each step are substantially similar to the first embodiment.

The following effects can be obtained in the embodiment.

(1) Since P that is a homologous element (a group 15) of N is used, a conductive thin film having properties (characteristics) similar to a conductive thin film when an element except for a metal element is only N among elements that compose (constitute) the conductive thin film can be formed.

(2) Since P having lower electronegativity than N is used, the TiPN film having a lower work function than the TiN film can be formed.

(3) Since the TiPN film serving as a metal film is formed using two elements of N and P, the work function of the TiPN film can be tuned by controlling the P concentration (or the N concentration).

(4) Since the TiP film is formed after formation of the TiN film, a growth of the TiP film can be accelerated using the TiN film as a seed (species) film.

Fourth Embodiment of the Present Invention

Figure 8:
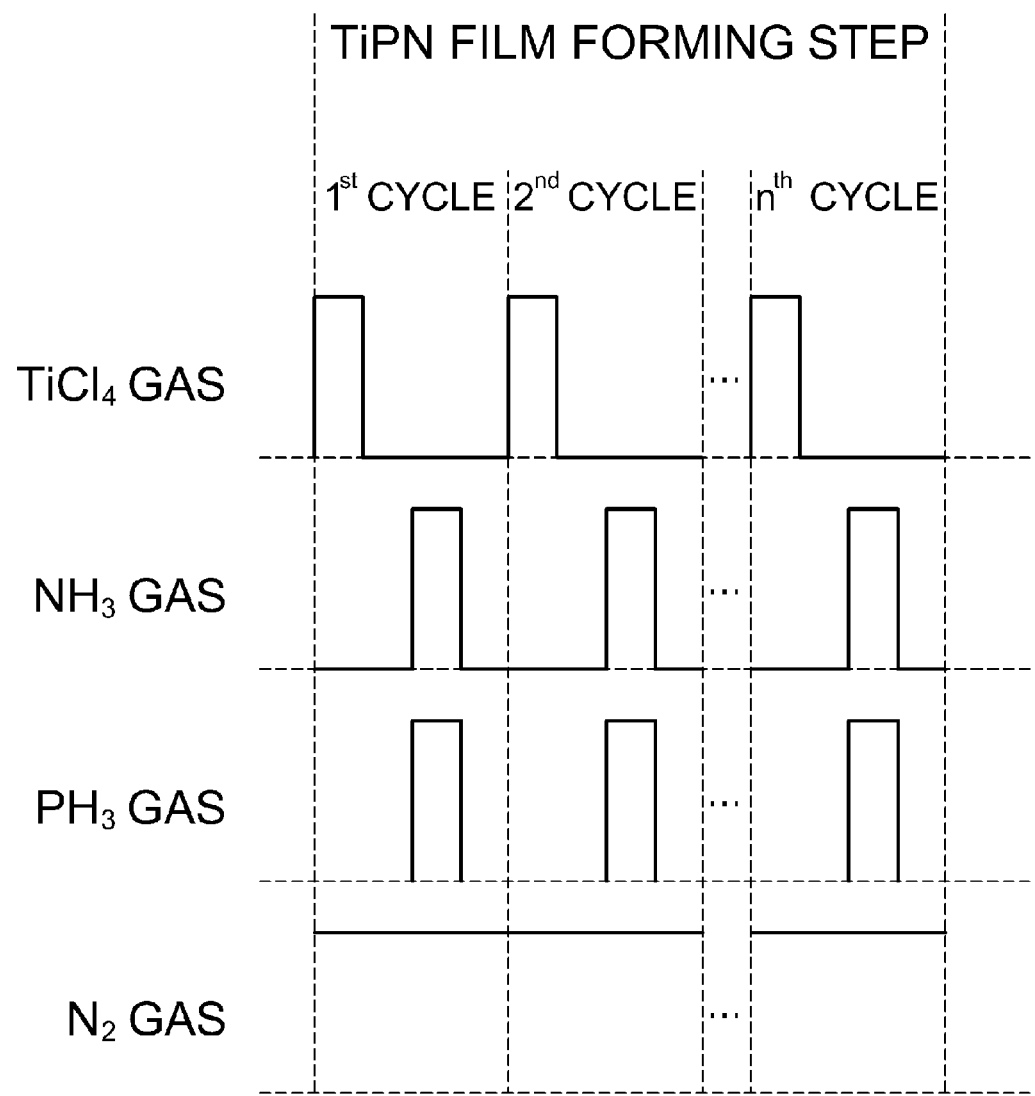
FIG. 8 illustrates a timing chart of a film-forming sequence in accordance with a fourth embodiment of the present invention.

The embodiment is distinguished from the first embodiment in that the $NH_3$ gas and the $PH_3$ gas are simultaneously supplied like FIG. 8 and Equation 5. Detailed description of the same parts as the first embodiment will be omitted, and different parts from the first embodiment will be described. In addition, in Equation 5, "$NH_3+PH_3$" means that $NH_3$ and $PH_3$ are simultaneously supplied.

$(TiCl_4 \rightarrow NH_3+PH_3) \times n \Rightarrow TiPN$ [Equation 5]

In an exemplary sequence of the embodiment, a film (for example, TiPN film) including Ti, N and P is formed on the wafer 200 by sequentially performing a process of supplying and exhausting a halogen-based source gas (for example, $TiCl_4$ gas) including a first element (for example, Ti) onto the wafer 200; and a process of simultaneously supplying a first reactive gas (for example, $NH_3$ gas) including a second element (for example, N) and a second reactive gas (for example, $PH_3$ gas) including a third element (for example, P) that is a homologous element of the second element onto the wafer 200 a predetermined number of times (n times).

In the embodiment, the TiPN film is formed by performing a cycle a predetermined number of times (n times), the cycle including the $TiCl_4$ gas supply step, the remaining gas removing step, the $NH_3$ gas and $PH_3$ gas supply step and the remaining gas removing step that are sequentially performed in the TiPN film forming step.

In addition, when a plurality of gases are "simultaneously supplied", the plurality of gases may be supplied together, or supply start timing and supply stop timing may be equal to each other or may be different from each other. That is, one of the gases may flow first or the other gas may first stop. For example, FIG. 8 shows an example in which both of the supply start timing and the supply stop timing are equal to each other.

(TiPN Film Forming Step)

Hereinafter, a step of forming the TiPN film will be described. The TiPN film forming step includes a $TiCl_4$ gas supply step, a remaining gas removing step, a $NH_3$ gas and $PH_3$ gas supply step and a remaining gas removing step, which will be described below. Since a processing sequence and a processing condition of the $TiCl_4$ gas supply step and a remaining gas removing step are substantially similar to the first embodiment, description thereof will be omitted.

($NH_3$ Gas and $PH_3$ Gas Supply Step)

The titanium-containing layer is formed in the $TiCl_4$ gas supply step, the remaining gas in the processing chamber 201 is removed in the remaining gas removing step, and then, the valves 324 and 334 are opened and the $NH_3$ gas and the $PH_3$ gas flow through the gas supply pipes 320 and 330. A flow rate of the $NH_3$ gas flowing through the gas supply pipe 320 is adjusted by the MFC 322. A flow rate of the $PH_3$ gas flowing through the gas supply pipe 330 is adjusted by the MFC 332, and the $PH_3$ gas is supplied into the gas supply pipe 320. The $NH_3$ gas and the $PH_3$ gas flowing through the gas supply pipe 320 are supplied into the processing chamber 201 through the gas supply hole 420a of the nozzle 420 to be exhausted through the exhaust pipe 231. Here, the $NH_3$ gas and the $PH_3$ gas are supplied onto the wafer 200. That is, the surface of the wafer 200 is exposed to the $NH_3$ gas and the $PH_3$ gas. Here, the valves 524 and 534 are opened and the $N_2$ gas flows through the carrier gas supply pipes 520 and 530 simultaneously. A flow rate of the $N_2$ gas flowing through the carrier gas supply pipe 520 is adjusted by the MFC 522. A flow rate of the $N_2$ gas flowing through the carrier gas supply pipe 530 is adjusted by the MFC 532 and the $N_2$ gas is supplied into the gas supply pipe 330. The $N_2$ gas flowing through the carrier gas supply pipes 520 and 530 is supplied into the processing chamber 201 to be exhausted through the exhaust pipe 231 together with the $NH_3$ gas and the $PH_3$ gas. Here, in order to prevent intrusion of the $NH_3$ gas and the $PH_3$ gas into the nozzle 410, the valve 514 is opened and the $N_2$ gas flows through the carrier gas supply pipe 510. The $N_2$ gas is supplied into the processing chamber 201 via the gas supply pipe 310 and the nozzle 410 to be exhausted through the exhaust pipe 231.

The pressure in the processing chamber 201 is regulated to a range of, for example, 1 Pa to 70,000 Pa, preferably 1 Pa to 1,330 Pa, for example, 50 Pa to 100 Pa by appropriately adjusting the APC valve 243 when the $NH_3$ gas flows. The pressure in the processing chamber 201 is regulated to a range of, for example, 1 Pa to 70,000 Pa, preferably 1 Pa to 1,330 Pa, for example, 50 Pa to 100 Pa by appropriately adjusting the APC valve 243 when the $PH_3$ gas flows. In addition, since the number of collisions of the $PH_3$ gas with the wafer 200 can be increased and decreased by controlling a pressure (a partial pressure) of the $PH_3$ gas, a decomposition level of the $PH_3$ gas can be controlled, and thus, reactivity can be controlled. For example, since the number of collisions of the $PH_3$ gas with the wafer 200 is increased when the pressure of the $PH_3$ gas is increased, decomposition of the $PH_3$ gas is further performed to increase reactivity. Accordingly, a reaction of the titanium-containing layer with the adsorption site can be accelerated even at the same gas supply time.

A supply flow rate of the $NH_3$ gas controlled by the MFC 322 is, for example, 1 slm to 20 slm, preferably 1 slm to 10 slm, for example, 7.5 slm. The supply flow rate of the $NH_3$ gas is appropriately varied according to a concentration of the phosphorus (P) introduced into the layer. For example, when the P concentration is increased, consumption of the adsorption site by N is reduced by decreasing the supply flow rate of the $NH_3$ gas, and the adsorption site in which a substitution of P can be performed is increased. A supply flow rate of the $PH_3$ gas controlled by the MFC 332 is, for example, 1 slm to 20 slm, preferably 1 slm to 10 slm, for example, 7.5 slm. A supply flow rate of the $N_2$ gas controlled by the MFCs 512, 522 and 532 is, for example, 1 slm to 20 slm, preferably 5 slm to 15 slm, for example, 7 slm.

A time of supplying the $NH_3$ gas onto the wafer 200, i.e., a gas supply time (a radiation time) is, for example, 0.01 to 300 seconds, preferably 1 to 60 seconds, for example, 15 seconds. A time of supplying the $PH_3$ gas onto the wafer 200, i.e., a gas supply time (radiation time) is, for example, 0.01 to 300 seconds, preferably 1 to 60 seconds, for example, 15 seconds.

A supply concentration of the $PH_3$ gas is, for example, 0.5% to 10%, preferably 1% to 5%, for example, 1%. When the concentration is 10% or less, excessive autolysis of the $PH_3$ gas can be suppressed, and when the concentration is 0.5% or more, lack of adsorption of the $PH_3$ gas to the wafer 200 can be suppressed. Here, a temperature of the heater 207 is set to the same temperature as in the TiCl$_4$ gas supply step.

Here, the gases flowing through the processing chamber 201 are the NH$_3$ gas, the PH$_3$ gas and the N$_2$ gas. The NH$_3$ gas and the PH$_3$ gas are substituted with a portion of the titanium-containing layer (i.e., the adsorption site of the titanium-containing layer) formed on the wafer 200 in the TiCl$_4$ gas supply step. The TiPN layer having a predetermined composition ratio is formed on the wafer 200. In addition, here, while not a major reaction, intermediates of the NH$_3$ gas may react with the PH$_3$ gas to react with the adsorption site or to be introduced into the TiPN layer. In addition, upon substitution of the NH$_3$ gas with the adsorption site, P may be introduced. The TiPN layer may include the remaining Cl as impurities. When the NH$_3$ gas and the PH$_3$ gas are supplied through another nozzle, while distribution in a surface of the wafer 200 may be varied at the NH$_3$ gas and the PH$_3$ gas to deteriorate film thickness uniformity in the surface, the film thickness uniformity in the surface can be improved by simultaneously supplying (premixing) the NH$_3$ gas and the PH$_3$ gas.

(Remaining Gas Removing Step)

After the TiPN layer is formed, the valves 324 and 334 are closed to stop supply of the NH$_3$ gas and the PH$_3$ gas. Here, the APC valve 243 is opened, and the inside of the processing chamber 201 is vacuum-exhausted by the vacuum pump 246 to discharge the unreacted NH$_3$ gas and PH$_3$ gas remaining in the processing chamber 201 or the NH$_3$ gas and PH$_3$ gas after contribution to formation of the TiPN layer from the processing chamber 201. That is, the unreacted NH$_3$ gas and PH$_3$ gas remaining in the space in which the wafer 200 on which the TiPN layer is formed is provided or the NH$_3$ gas and PH$_3$ gas after contribution to formation of the TiPN layer are removed. Here, the valves 514, 524 and 534 are opened to maintain the supply of the N$_2$ gas into the processing chamber 201. The N$_2$ gas acts as a purge gas, and thus, an effect of discharging the unreacted NH$_3$ gas and PH$_3$ gas remaining in the processing chamber 201 or the NH$_3$ gas and PH$_3$ gas after contribution to formation of the TiPN layer from the processing chamber 201 can be improved.

Here, like the remaining gas removing step after the TiCl$_4$ gas supply step, the gas remaining in the processing chamber 201 may not be completely discharged, or the inside of the processing chamber 201 may not be completely purged.

(Performed Predetermined Number of Times)

The TiPN film having a predetermined thickness (for example, 0.1 nm to 10 nm) is formed on the wafer 200 by performing a cycle including the TiCl$_4$ gas supply step, the remaining gas removing step, the NH$_3$ gas and PH$_3$ gas supply step and the remaining gas removing step that are sequentially performed time-divisionally one time or more (a predetermined number of times), i.e., setting the processing of the TiCl$_4$ gas supply step, the remaining gas removing step, the NH$_3$ gas and PH$_3$ gas supply step and the remaining gas removing step as 1 cycle and performing the processing n cycles (n is an integer of 1 or more). The above-mentioned cycles may be performed a plurality of times.

The following effects can be obtained in the embodiment.

(1) Since P that is a homologous element (a group 15) of N is used, a conductive thin film having properties (characteristics) similar to a conductive thin film when an element except for a metal element is only N among elements that compose (constitute) the conductive thin film can be formed.

(2) Since P having lower electronegativity than N is used, the TiPN film having a lower work function than the TiN film can be formed.

(3) Since the TiPN film serving as a metal film is formed using two elements of N and P, the work function of the TiPN film can be tuned by controlling the P concentration (or the N concentration).

(4) Since intermediates of the NH$_3$ gas may react with the PH$_3$ gas or P may be introduced upon substitution of the NH$_3$ gas with the adsorption site as the NH$_3$ gas and the PH$_3$ gas are simultaneously supplied, the P concentration in the TiPN film can be increased.

(5) Uniformity in surface of the wafer can be improved by simultaneously supplying (premixing) the NH$_3$ gas and the PH$_3$ gas.

(6) Throughput can be improved by simultaneously supplying (premixing) the NH$_3$ gas and the PH$_3$ gas.

Fifth Embodiment of the Present Invention

In the embodiment, as represented in Equation 6, the TiPN film is formed on the wafer 200 by forming the TiN film through the processing similar to the TiN film forming step in the third embodiment (the processing of the n$_2$ cycles is performed) after the TiPN film is formed through the processing similar to the TiPN film forming step of the first embodiment (the processing of n$_1$ cycles is performed), and performing the TiPN film forming step and the TiN film forming step a predetermined number of times (the processing of n$_3$ cycles). Since a processing sequence and a processing condition of each step are substantially similar to the first embodiment and the third embodiment, description thereof will be omitted.

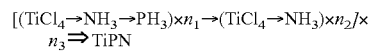
[Equation 6]

In an exemplary sequence of the embodiment, a first film (for example, a first TiPN film) including Ti, P and N is formed by performing a first cycle a predetermined number of times (n$_1$ times), the first cycle including sequentially a process of supplying and exhausting a halogen-based source gas (for example, TiCl$_4$ gas) including a first element (for example, Ti) onto the wafer 200, a process of supplying (or supply and exhausting) a first reactive gas (for example, NH$_3$ gas) including a second element (for example, N) onto the wafer 200, and a process of supplying and exhausting a second reactive gas (for example, PH$_3$ gas) including a third element (for example, P) that is a homologous element of the second element onto the wafer 200. In addition, a film (for example, TiN film) including Ti and N is formed by performing a second cycle a predetermined number of times (n$_2$ times), the second cycle including sequentially a process of supplying and exhausting a halogen-based source gas (for example, TiCl$_4$ gas) including a first element (for example, Ti) onto the wafer 200, and a process of supplying (or supplying and exhausting) a first reactive gas (for example, NH$_3$ gas) including a second element (for example, N) onto the wafer 200. A second film (for example, a second TiPN film) including Ti, N and P is formed on the wafer 200 by performing the first cycle and the second cycle sequentially a predetermined number of times (n$_3$ times).

The following effects can be obtained in the embodiment.

(1) Since P that is a homologous element (a group 15) of N is used, a conductive thin film having properties (characteristics) similar to a conductive thin film when an element except for a metal element is only N among elements that compose (constitute) the conductive thin film can be formed.

(2) Since P having lower electronegativity than N is used, the TiPN film having a lower work function than the TiN film can be formed.

(3) Since the TiPN film serving as a metal film is formed using two elements of N and P, the work function of the TiPN film can be tuned by controlling the P concentration (or the N concentration).

(4) Since the NH$_3$ gas flows before the PH$_3$ gas after formation of the titanium-containing layer when the first TiPN film is formed, the amount of P (P concentration) introduced into the TiPN film can be adjusted according to the exposure amount of the PH$_3$ gas (using the exposure amount of the PH$_3$ gas as a major parameter). That is, the work function of the TiPN film can be tuned.

(5) The amount of P introduced into the TiPN film (the P concentration of the TiPN film) can be further reduced by performing the TiN film forming step after the first TiPN film forming step.

(6) Since the TiPN layer can be coated with the TiN layer by performing the TiN film forming step after the first TiPN film forming step, exposure of the P that can be easily oxidized to the outermost surface can be prevented to suppress an increase in resistance ratio due to surface oxidation.

Figure 9:
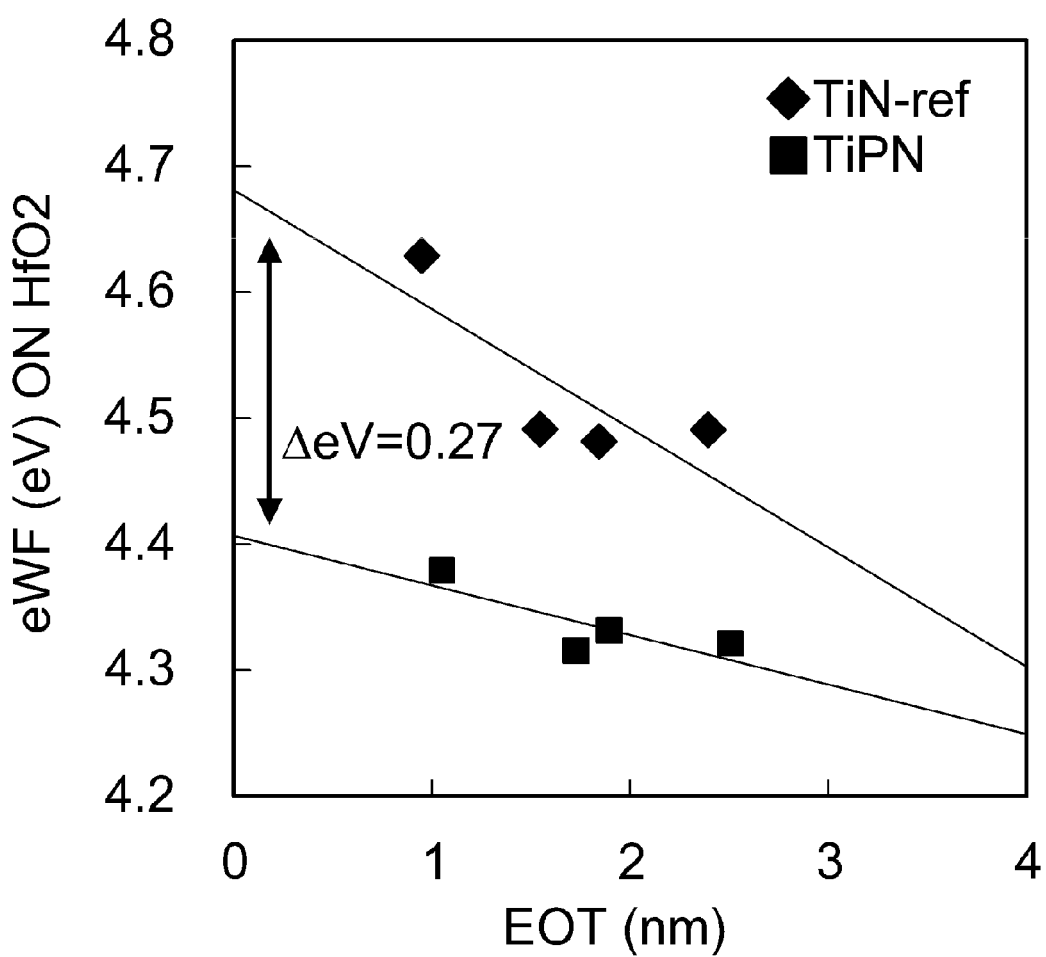
FIG. 9 is a graph illustrating a relation between an equivalent oxide layer thickness (EOT) and an effective work function (eWF) of an example and a comparative example of the present invention.
Figure 10:
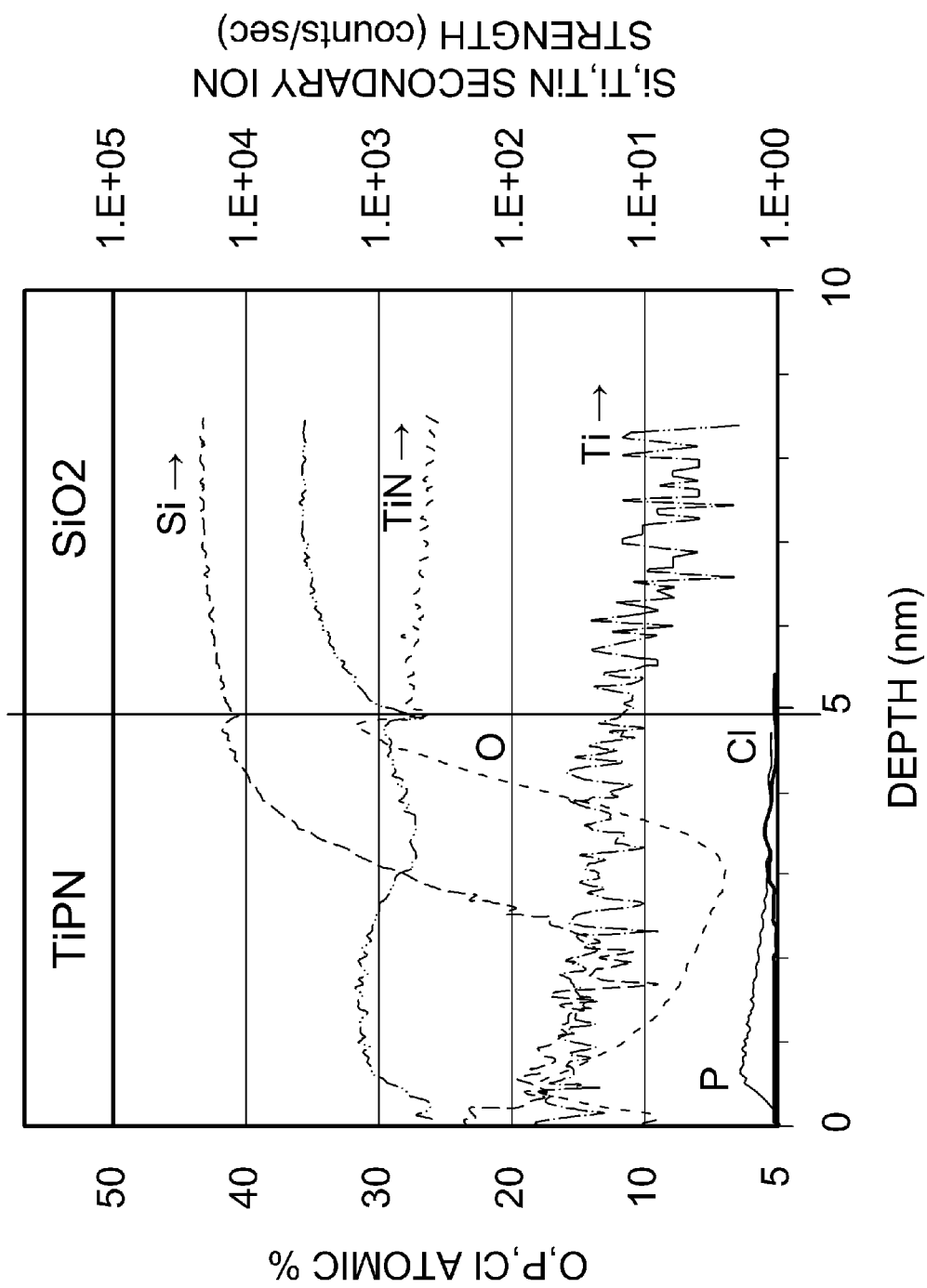
FIG. 10 is a graph illustrating data of SIMS of a TiPN film of the example of the present invention.

Data of the example of the present invention are shown in FIGS. 9 and 10. FIG. 9 shows data (rectangular shapes) of an effective work function of the TiPN film formed according to the present invention and data (diamond shapes) of the TiN film according to a comparative example. FIG. 10 shows data of secondary ion mass spectrometry (SIMS) of the TiPN film formed according to the present invention.

The sequence of the first embodiment is used in the example, and the process conditions are as follows.

A heater temperature: 380° C., pressure in the processing chamber: 60 Pa, a supply flow rate of TiCl$_4$ gas: 0.01 cc, a supply time of TiCl$_4$ gas: 2 seconds, a supply flow rate of NH$_3$ gas: 300 cc, a supply time of NH$_3$ gas: 20 seconds, a supply flow rate of PH$_3$ gas: 300 cc (1% He diluted), a supply time of PH$_3$ gas: 20 seconds, cycle number: 200.

As shown in FIG. 9, both of the TiPN film and the TiN film were formed on a hafnium oxide film (an HfO$_2$ film) serving as a high-k film (a high permittivity insulating film) formed on an SiO$_2$ substrate. An effective work function (eWF) of the TiN film was 4.68 eV, an eWF of the TiPN film was 4.41 eV, and thus, it was checked that 0.27 eV is decreased.

In addition, as a result of analyzing the TiPN film obtained as shown in FIG. 10 through the SIMS, it will be appreciated that, at a film thickness of 2 nm, a chlorine (Cl) concentration is 0.12%, an oxygen (O) concentration is 6.42%, a phosphorus (P) concentration is 1.42%, and P is included in the TiN film.

Another Embodiment

The present invention is not limited to the embodiment but various modifications may be made without departing from the spirit of the present invention.

For example, while the sequence of Equation 2 to Equation 6 has been described in the first to fifth embodiments, the present invention is not limited thereto but may be applied to, for example, the following sequence.

$$(NH_3 \rightarrow TiCl_4 \rightarrow PH_3) \times n \Rightarrow TiPN \quad [\text{Equation 7}]$$

$$(NH_3 \rightarrow PH_3 \rightarrow TiCl_4) \times n \Rightarrow TiPN \quad [\text{Equation 8}]$$

$$(PH_3 \rightarrow NH_3 \rightarrow TiCl_4) \times n \Rightarrow TiPN \quad [\text{Equation 9}]$$

$$(PH_3 \rightarrow TiCl_4 \rightarrow NH_3) \times n \Rightarrow TiPN \quad [\text{Equation 10}]$$

$$(NH_3 + PH_3 \rightarrow TiCl_4) \times n \Rightarrow TiPN \quad [\text{Equation 11}]$$

$$(TiCl_4 \rightarrow NH_3 \rightarrow TiCl_4 \rightarrow PH_3) \times n \Rightarrow TiPN \quad [\text{Equation 12}]$$

$$(TiCl_4 \rightarrow PH_3 \rightarrow TiCl_4 \rightarrow NH_3) \times n \Rightarrow TiPN \quad [\text{Equation 13}]$$

$$[(TiCl_4 \rightarrow PH_3) \times n_1 \rightarrow (TiCl_4 \rightarrow NH_3) \times n_2] \times n_3 \Rightarrow TiPN \quad [\text{Equation 14}]$$

$$[(TiCl_4 \rightarrow NH_3 + PH_3) \times n_1 \rightarrow (TiCl_4 \rightarrow NH_3) \times n_2] \times n_3 \Rightarrow TiPN \quad [\text{Equation 15}]$$

$$[(TiCl_4 \rightarrow NH_3) \times n_1 \rightarrow (TiCl_4 \rightarrow PH_3) \times n_2] \times n_3 \Rightarrow TiPN \quad [\text{Equation 16}]$$

$$(NH_3 \rightarrow TiCl_4 \rightarrow PH_3) \times n_1 \rightarrow (TiCl_4 \rightarrow NH_3) \times n_2] \times n_3 \Rightarrow TiPN \quad [\text{Equation 17}]$$

$$(NH_3 \rightarrow PH_3 \rightarrow TiCl_4) \times n_1 \rightarrow (TiCl_4 \rightarrow NH_3) \times n_2] \times n_3 \Rightarrow TiPN \quad [\text{Equation 18}]$$

$$(PH_3 \rightarrow NH_3 \rightarrow TiCl_4) \times n_1 \rightarrow (TiCl_4 \rightarrow NH_3) \times n_2] \times n_3 \Rightarrow TiPN \quad [\text{Equation 19}]$$

$$(PH_3 \rightarrow TiCl_4 \rightarrow NH_3) \times n_1 \rightarrow (TiCl_4 \rightarrow NH_3) \times n_2] \times n_3 \Rightarrow TiPN \quad [\text{Equation 20}]$$

$$(NH_3 + PH_3 \rightarrow TiCl_4) \times n_1 \rightarrow (TiCl_4 \rightarrow NH_3) \times n_2] \times n_3 \Rightarrow TiPN \quad [\text{Equation 21}]$$

$$(TiCl_4 \rightarrow NH_3 \rightarrow TiCl_4 \rightarrow PH_3) \times n \Rightarrow TiPN \quad [\text{Equation 22}]$$

$$(TiCl_4 \rightarrow PH_3 \rightarrow TiCl_4 \rightarrow NH_3) \times n_1 \rightarrow (TiCl_4 \rightarrow NH_3) \times n_2] \times n_3 \Rightarrow TiPN \quad [\text{Equation 23}]$$

$$[(TiCl_4 \rightarrow NH_3) \times n_1 \rightarrow (TiCl_4 \rightarrow NH_3 \rightarrow PH_3) \times n_2] \times n_3 \Rightarrow TiPN \quad [\text{Equation 24}]$$

$$[(TiCl_4 \rightarrow NH_3) \times n_1 \rightarrow (TiCl_4 \rightarrow NH_3 + PH_3) \times n_2] \times n_3 \Rightarrow TiPN \quad [\text{Equation 25}]$$

$$(TiCl_4 \rightarrow NH_3) \times n_1 \rightarrow [(NH_3 \rightarrow TiCl_4 \rightarrow PH_3) \times n_2] \times n_3 \Rightarrow TiPN \quad [\text{Equation 26}]$$

$$(TiCl_4 \rightarrow NH_3) \times n_1 \rightarrow [(NH_3 \rightarrow PH_3 \rightarrow TiCl_4) \times n_2] \times n_3 \Rightarrow TiPN \quad [\text{Equation 27}]$$

$$(TiCl_4 \rightarrow NH_3) \times n_1 \rightarrow [(PH_3 \rightarrow NH_3 \rightarrow TiCl_4) \times n_2] \times n_3 \Rightarrow TiPN \quad [\text{Equation 28}]$$

$$(TiCl_4 \rightarrow NH_3) \times n_1 \rightarrow [(PH_3 \rightarrow TiCl_4 \rightarrow NH_3) \times n_2] \times n_3 \Rightarrow TiPN \quad [\text{Equation 29}]$$

$$(TiCl_4 \rightarrow NH_3) \times n_1 \rightarrow [(NH_3 + PH_3 \rightarrow TiCl_4) \times n_2] \times n_3 \Rightarrow TiPN \quad [\text{Equation 30}]$$

$$(TiCl_4 \rightarrow NH_3) \times n_1 \rightarrow [(TiCl_4 \rightarrow NH_3 \rightarrow TiCl_4 \rightarrow PH_3) \times n_2] \times n_3 \Rightarrow TiPN \quad [\text{Equation 31}]$$

$$(TiCl_4 \rightarrow NH_3) \times n_1 \rightarrow [(TiCl_4 \rightarrow PH_3 \rightarrow TiCl_4 \rightarrow NH_3) \times n_2] \times n_3 \Rightarrow TiPN \quad [\text{Equation 32}]$$

$$[(TiCl_4 \rightarrow NH_3 \rightarrow PH_3) \times n_1 \rightarrow (TiCl_4 \rightarrow PH_3) \times n_2] \times n_3 \Rightarrow TiPN \quad [\text{Equation 33}]$$

$$[(TiCl_4 \rightarrow NH_3 + PH_3) \times n_1 \rightarrow (TiCl_4 \rightarrow NH_3) \times n_2] \times n_3 \Rightarrow TiPN \quad [\text{Equation 34}]$$

$$[(NH_3 \rightarrow TiCl_4 \rightarrow PH_3) \times n_1 \rightarrow (TiCl_4 \rightarrow PH_3) \times n_2] \times n_3 \Rightarrow TiPN \quad [\text{Equation 35}]$$

$$[(NH_3 \rightarrow PH_3 \rightarrow TiCl_4) \times n_1 \rightarrow (TiCl_4 \rightarrow PH_3) \times n_2] \times n_3 \Rightarrow TiPN \quad [\text{Equation 36}]$$

$$[(PH_3 \rightarrow NH_3 \rightarrow TiCl_4) \times n_1 \rightarrow (TiCl_4 \rightarrow PH_3) \times n_2] \times n_3 \Rightarrow TiPN \quad [\text{Equation 37}]$$

$$[(PH_3 \rightarrow TiCl_4 \rightarrow NH_3) \times n_1 \rightarrow (TiCl_4 \rightarrow PH_3) \times n_2] \times n_3 \Rightarrow TiPN \quad \text{[Equation 38]}$$

$$[(NH_3+PH_3 \rightarrow TiCl_4) \times n_1 \rightarrow (TiCl_4 \rightarrow PH_3) \times n_2] \times n_3 \Rightarrow TiPN \quad \text{[Equation 39]}$$

$$[(TiCl_4 \rightarrow NH_3 \rightarrow TiCl_4 \rightarrow PH_3) \times n_1 \rightarrow (TiCl_4 \rightarrow PH_3) \times n_2] \times n_3 \Rightarrow TiPN \quad \text{[Equation 40]}$$

$$[(TiCl_4 \rightarrow PH_3 \rightarrow TiCl_4 \rightarrow NH_3) \times n_1 \rightarrow (TiCl_4 \rightarrow PH_3) \times n_2] \times n_3 \Rightarrow TiPN \quad \text{[Equation 41]}$$

$$[(TiCl_4 \rightarrow PH_3) \times n_1 \rightarrow (TiCl_4 \rightarrow NH_3 \rightarrow PH_3) \times n_2] \times n_3 \Rightarrow TiPN \quad \text{[Equation 42]}$$

$$[(TiCl_4 \rightarrow PH_3) \times n_1 \rightarrow (TiCl_4 \rightarrow NH_3+PH_3) \times n_2] \times n_3 \Rightarrow TiPN \quad \text{[Equation 43]}$$

$$(TiCl_4 \rightarrow PH_3) \times n_1 \rightarrow [(NH_3 \rightarrow TiCl_4 \rightarrow PH_3) \times n_2] \times n_3 \Rightarrow TiPN \quad \text{[Equation 44]}$$

$$(TiCl_4 \rightarrow PH_3) \times n_1 \rightarrow [(NH_3 \rightarrow PH_3 \rightarrow TiCl_4) \times n_2] \times n_3 \Rightarrow TiPN \quad \text{[Equation 45]}$$

$$(TiCl_4 \rightarrow PH_3) \times n_1 \rightarrow [(PH_3 \rightarrow NH_3 \rightarrow TiCl_4) \times n_2] \times n_3 \Rightarrow TiPN \quad \text{[Equation 46]}$$

$$(TiCl_4 \rightarrow PH_3) \times n_1 \rightarrow [((PH_3 \rightarrow TiCl_4 \rightarrow NH_3) \times n_2] \times n_3 \Rightarrow TiPN \quad \text{[Equation 47]}$$

$$(TiCl_4 \rightarrow PH_3) \times n_1 \rightarrow [(NH_3+PH_3 \rightarrow TiCl_4) \times n_2] \times n_3 \Rightarrow TiPN \quad \text{[Equation 48]}$$

$$(TiCl_4 \rightarrow PH_3) \times n_1 \rightarrow [(TiCl_4 \rightarrow NH_3 \rightarrow TiCl_4 \rightarrow PH_3) \times n_2] \times n_3 \Rightarrow TiPN \quad \text{[Equation 49]}$$

$$(TiCl_4 \rightarrow PH_3) \times n_1 \rightarrow [(TiCl_4 \rightarrow PH_3 \rightarrow TiCl_4 \rightarrow NH_3) \times n_2] \times n_3 \Rightarrow TiPN \quad \text{[Equation 50]}$$

In the above-mentioned embodiments, when the TiPN film is formed, while an example using $TiCl_4$ serving as a titanium-containing source gas that is a halogen-based source gas has been described, for example, titanium tetrafluoride ($TiF_4$), titanium tetrabromide ($TiBr_4$), titanium tetraiodide ($TiI_4$), or the like, may also be applied.

In the above-mentioned embodiments, while an example using titanium (Ti) serving as a metal element has been described, the present invention is not limited thereto and tantalum (Ta), tungsten (W), hafnium (Hf), zirconium (Zr), aluminum (Al), cobalt (Co), yttrium (Y), ruthenium (Ru) and molybdenum (Mo), or the like, may be used, and in this case, a tantalum (Ta)-containing gas, a tungsten (W)-containing gas, a hafnium (Hf)-containing gas, a zirconium (Zr)-containing gas, an aluminum (Al)-containing gas, a cobalt (Co)-containing gas, a yttrium (Y)-containing gas, a ruthenium (Ru)-containing gas, a molybdenum (Mo)-containing gas, or the like, may be used as the halogen-based source gas.

While an example using the TiPN film serving as a titanium-containing film has been described, the present invention is not limited thereto, and any metal film formed using a halogen-based source gas may be applied, and for example, a metal film such as a tantalum phosphide nitride film (a TaPN film) serving as a tantalum (Ta)-containing film, a tungsten phosphide nitride film (a WPN film) serving as tungsten (W)-containing film, a hafnium phosphide nitride film (a HfPN film) serving as a hafnium (Hf)-containing film, a zirconium phosphide nitride film (a ZrPN film) serving as a zirconium (Zr)-containing film, an aluminum phosphide nitride film (an AlPN film) serving as an aluminum (Al)-containing film, a cobalt phosphide nitride film (a CoPN film) serving as a cobalt (Co)-containing film, a yttrium phosphide nitride film (a YPN film) serving as a yttrium (Y)-containing film, a ruthenium phosphide nitride film (a RuPN film) serving as a ruthenium (Ru)-containing film, a molybdenum phosphide nitride film (a MoPN film) serving as a molybdenum (Mo)-containing film, or a composite film thereof may be applied.

When the above-mentioned metal film is formed, halide such as tantalum pentachloride ($TaCl_5$), tantalum pentafluoride ($TaF_5$), tantalum pentabromide ($TaBr_5$), tantalum pentaiodide ($TaI_5$), tungsten hexachloride ($WCl_6$), tungsten hexafluoride ($WF_6$), tungsten hexabromide ($WBr_6$), tungsten hexaiodide ($WI_6$), hafnium tetrachloride ($HfCl_4$), hafnium tetrafluoride ($HfF_4$), hafnium tetrabromide ($HfBr_4$), hafnium tetraiodide ($HfI_4$), zirconium tetrachloride ($ZrCl_4$), zirconium tetrafluoride ($ZrF_4$), zirconium tetrabromide ($ZrBr_4$), zirconium tetraiodide ($ZrI_4$), aluminum trichloride ($AlCl_3$), aluminum trifluoride ($AlF_3$), aluminum tribromide ($AlBr_3$), aluminum triiodide ($AlI_3$), cobalt dichloride ($CoCl_2$), cobalt difluoride ($CoF_2$), cobalt dibromide ($CoBr_2$), cobalt diiodide ($CoI_2$), yttrium trichloride ($YCl_3$), yttrium trifluoride ($YF_3$), yttrium tribromide ($YBr_3$), yttrium triiodide ($YI_3$), ruthenium trichloride ($RuCl_3$), ruthenium trifluoride ($RuF_3$), ruthenium tribromide ($RuBr_3$) and ruthenium triiodide ($RuI_3$), or the like, may be used as the halogen-based source gas.

In addition to the $NH_3$ gas, nitrogen ($N_2$), nitrous oxide ($N_2O$), diazene ($N_2H_2$) gas, hydrazine ($N_2H_4$) gas, $N_3H_8$ gas, monomethylhydrazine ($CH_6N_2$), dimethylhydrazine ($C_2H_8N_2$), monomethylamine [($CH_3$)$NH_2$], dimethylamine [($CH_3$)$_2NH$], trimethylamine [($CH_3$)$_3N$], monoethylamine ($CH_3CH_2NH_2$), diethylamine [($C_2H_5$)$_2NH$], triethylamine [($C_2H_5$)$_3N$], or the like, may be used as the nitriding/reducing agent.

In addition to P, arsenic (As), antimony (Sb) or bismuth (Bi) may be used as the third element that is the homologous element of N, and in this case, in addition to phosphorus hydride (phosphine, $PH_3$) serving as a phosphorus-containing gas, arsenic trihydride (arsine, $AsH_3$) serving as an arsenic (As)-containing gas, antimony trihydride (stibine, $SbH_3$) serving as an antimony (Sb)-containing gas, bismuth trihydride (bisbuthine, $BiH_3$) serving as a bismuth (Bi)-containing gas, or the like, may be used as the second reactive gas.

In addition to $N_2$ gas, a rare gas such as argon (Ar) gas, helium (He) gas, neon (Ne) gas, xenon (Xe) gas, or the like, may be used as the inert gas.

The above-mentioned embodiments, modifications or applications may be appropriately combined and used. In addition, processing conditions thereof may be the same processing conditions as in the above-mentioned embodiments.

A process recipe (a program in which a processing sequence, a processing condition, or the like, is written) used to form various thin films may be individually prepared (prepared in plural) according to contents of substrate processing (a film species, a composition ratio, a film quality, a film thickness, a processing sequence, a processing condition, or the like, of the formed thin film). In addition, when the substrate processing is started, an appropriate process recipe may be appropriately selected among the plurality of process recipes according to contents of the substrate processing. Specifically, the plurality of process recipes individually prepared according to the contents of the substrate processing may be previously stored (installed) in the storage device 121c included in the substrate processing apparatus via an electrical communication line or the recording medium (the external storage device 123) on which the process recipe is recorded. In addition, when the substrate processing is started, the CPU 121a included in the substrate processing apparatus may appropriately select an appropriate process recipe according to the contents of the substrate processing among the plurality of process recipes stored in the storage device 121c. Accordingly, the thin films having various film species, composition ratios, film qualities and film thicknesses can be universally or reproducibly formed by one substrate processing apparatus. In addition, a manipulation burden of an operator (an input burden of a processing sequence, a processing condition, or the like) can be reduced, and the substrate processing can be rapidly started while avoiding a manipulation error.

The above-mentioned process recipe is not limited to the case of new creation but, for example, may be realized by modifying the process recipe of the substrate processing apparatus of the related art. When the process recipe is modified, the process recipe according to the present invention may be installed at the substrate processing apparatus of the related art via the electrical communication line or the recording medium on which the process recipe is recorded, or the process recipe may be modified to the process recipe according to the present invention by manipulating the input/output device of the substrate processing apparatus of the related art.

In the above-mentioned embodiments, as the substrate processing apparatus serving as a batch type vertical apparatus for processing a plurality of substrates at a time, while the example in which the nozzle configured to supply the processing gas into one reaction pipe is vertically installed, and the film is formed using the processing furnace having the structure provided with the exhaust port installed under the reaction pipe has been described, the present invention may be applied when the film is formed using a processing furnace having another structure. For example, the present invention may be applied when the film is formed using the processing furnace having the structure in which two reaction pipes (a reaction pipe of an outer side is referred to as an outer tube, and a reaction pipe of an inner side is referred to as an inner tube) having concentric circles are provided, and the processing gas flows from the nozzle vertically installed in the inner tube to the exhaust port opened at a position opposite to the nozzle (a symmetrical position) via the sidewall of the outer tube and the substrate. In addition, the processing gas is not supplied through the nozzle vertically installed in the inner tube but may be supplied through a gas supply port opened at the sidewall of the inner tube. Here, the exhaust port opened at the outer tube may be opened according to a height at which the plurality of substrates stacked and accommodated in the processing chamber are present. In addition, the exhaust port may have a hole shape or a slit shape.

In the above-mentioned embodiments, while the example in which the film is formed using the substrate processing apparatus serving as the batch type vertical apparatus for processing the plurality of substrates at a time has been described, the present invention is not limited thereto but may be exemplarily applied to the case in which the film is formed using a sheet type substrate processing apparatus for processing one or a plurality of substrates at a time. In addition, in the above-mentioned embodiments, while the example in which the thin film is formed using the substrate processing apparatus including a hot wall type processing furnace has been described, the present invention is not limited thereto but may also be exemplarily applied to the case in which the thin film is formed using the substrate processing apparatus including a cold wall type processing furnace. Even in this case, the processing condition may be the same processing condition as in the above-mentioned embodiments.

Figure 11:
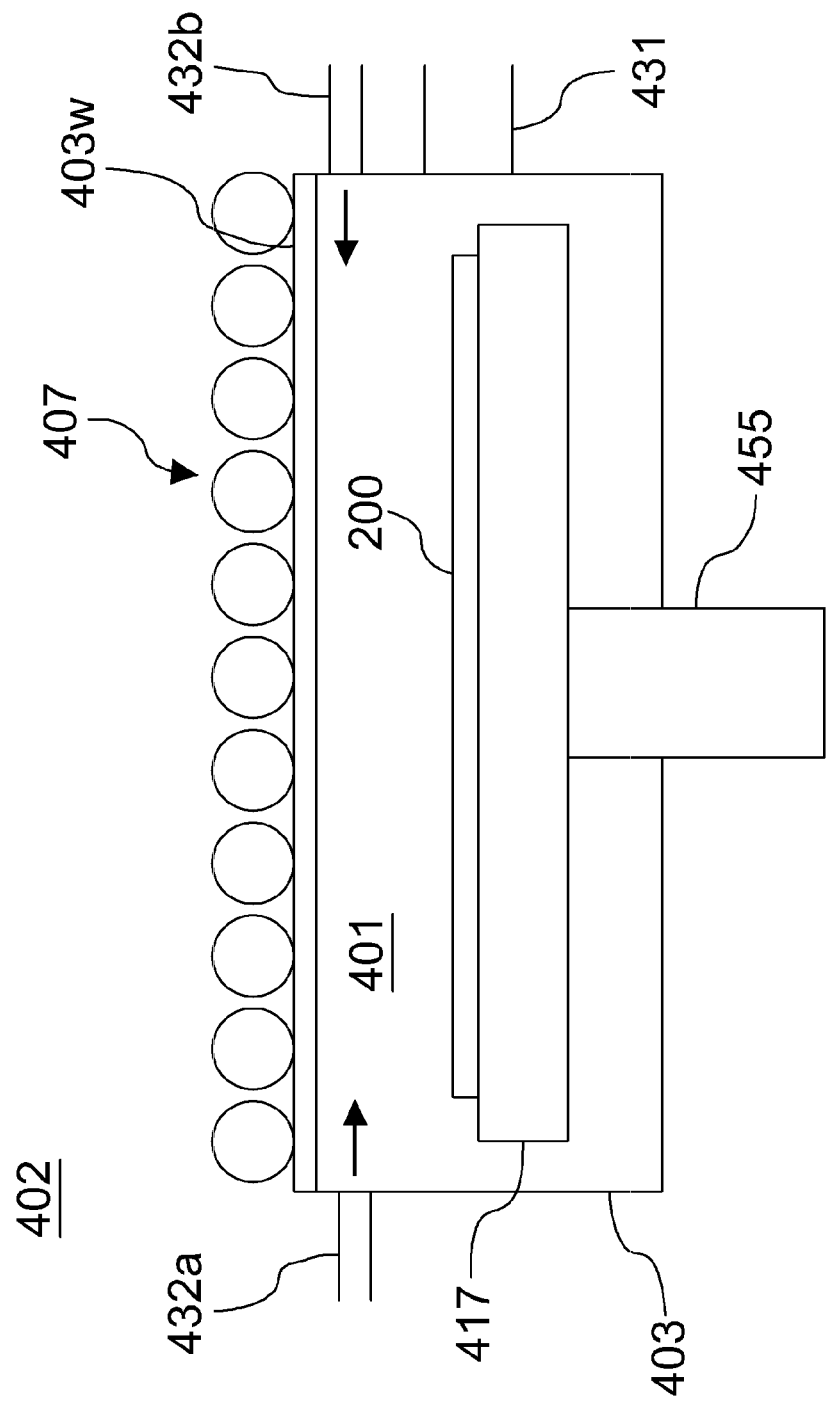
FIG. 11 schematically exemplifies a configuration of a processing furnace of a substrate processing apparatus used in another embodiment of the present invention, wherein a longitudinal cross-sectional view of a portion of the processing furnace is shown.

For example, the present invention may be exemplarily applied to even the case in which the film is formed using the substrate processing apparatus including a processing furnace 302 shown in FIG. 11. The processing furnace 302 includes a processing container 303 configured to form a processing chamber 301, a shower head 303s configured to supply a gas into the processing chamber 301 in a shower shape, a support frame 317 configured to support one or a plurality of wafers 200 in a horizontal posture, a rotary shaft 355 configured to support the support frame 317 from below, and a heater 307 installed at the support frame 317. A gas supply port 332a configured to supply the above-mentioned source gas and a gas supply port 332b configured to supply the above-mentioned reactive gas are connected to an inlet (a gas introduction port) of the shower head 303s. A source gas supply system similar to the source gas supply system of the above-mentioned embodiment is connected to the gas supply port 332a. A reactive gas supply system similar to the reactive gas supply system of the above-mentioned embodiment is connected to the gas supply port 332b. A gas diffusion plate configured to supply a gas into the processing chamber 301 in a shower shape is installed at an outlet (a gas discharge port) of the shower head 303s. An exhaust port 331 configured to exhaust the inside of the processing chamber 301 is installed at the processing container 303. An exhaust system similar to the exhaust system of the above-mentioned embodiment is connected to the exhaust port 331.

Figure 12:
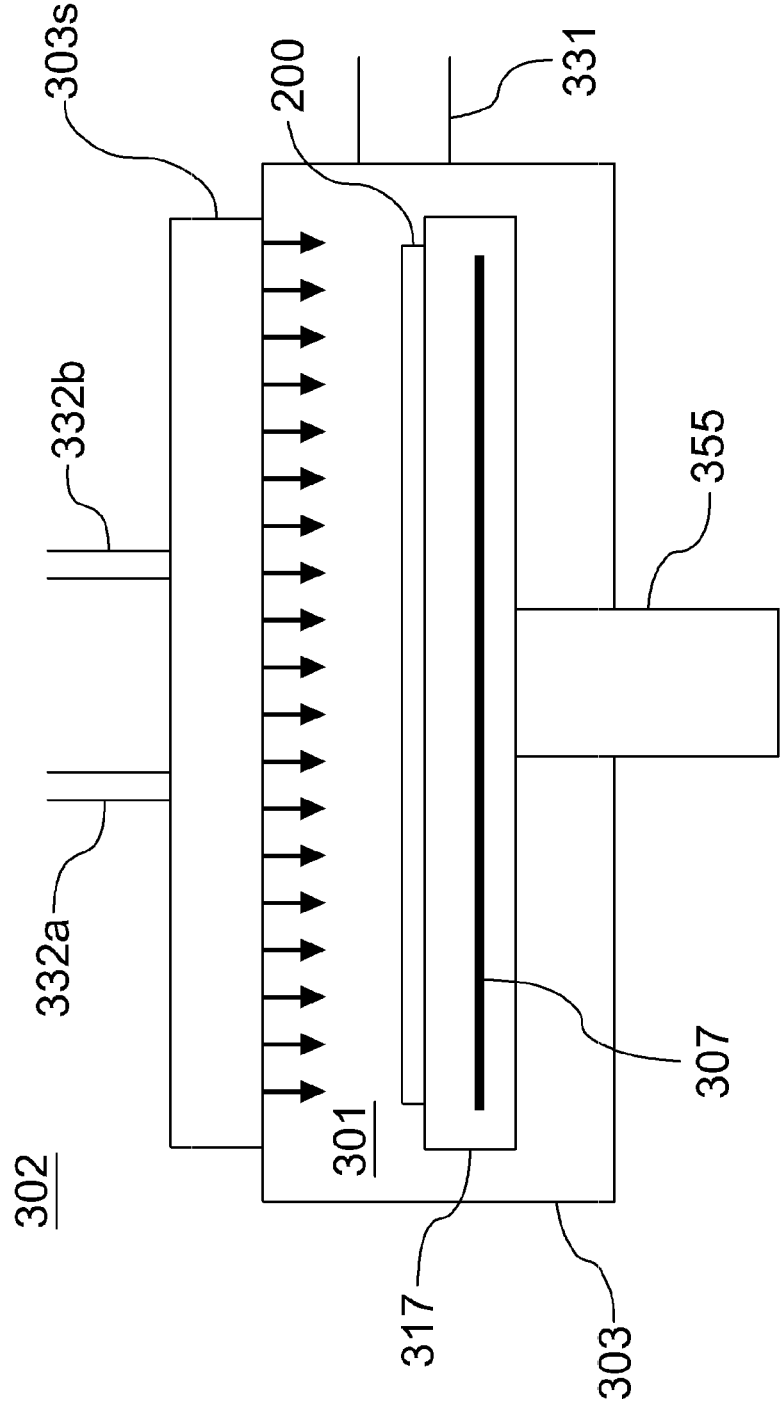
FIG. 12 schematically exemplifies a configuration of a processing furnace of a substrate processing apparatus used in still another embodiment of the present invention, wherein a longitudinal cross-sectional view of a portion of the processing furnace is shown.

In addition, the present invention may be exemplarily applied to the case in which a film is forming using a substrate processing apparatus including a processing furnace 402 shown in FIG. 12. The processing furnace 402 includes a processing container 403 configured to form a processing chamber 401, a support frame 417 configured to support one or a plurality of wafers 200 in a horizontal posture, a rotary shaft 455 configured to support the support frame 417 from below, a lamp heater 407 configured to radiate light to the wafer 200 of the processing container 403, and a quartz window 403w configured to allow penetration of the light from the lamp heater 407. A gas supply port 432a configured to supply the above-mentioned source gas and a gas supply port 432b configured to supply the above-mentioned reactive gas are connected to the processing container 403. A source gas supply system similar to the source gas supply system of the above-mentioned embodiment is connected to the gas supply port 432a. A reactive gas supply system similar to the gas supply system of the above-mentioned embodiment is connected to the gas supply port 432b. An exhaust port 431 configured to exhaust the inside of the processing chamber 401 is installed at the processing container 403. An exhaust system similar to the exhaust system of the above-mentioned embodiment is connected to the exhaust port 431.

Even when the substrate processing apparatus is used, the film can be formed under a sequence and a processing condition similar to the embodiments or variants.

According to the present invention, it is possible to provide a technology capable of adjusting a work function and forming a conductive thin film having a low work function value.

Hereinafter, preferred embodiments according to the present invention are supplementarily noted.

Supplementary Note 1

According to an aspect of the present invention, there is provided a method of manufacturing a semiconductor device or a substrate processing method, the method including: (a) accommodating a substrate in a process chamber; (b) forming a film including a first element, a second element and a third element in a same group as the second element on the substrate by performing a cycle a predetermined number of times, the cycle including: (b-1) supplying a halogen-based source gas including the first element to the substrate; (b-2) supplying a first reactive gas including the second element; and (b-3) supplying a second reactive gas including the third element, wherein the steps (b-1), (b-2) and (b-3) is performed time-divisionally (asynchronously, intermittently or pulsewisely) in the cycle; and (c) unloading the substrate from the process chamber.

Supplementary Note 2

In the method of Supplementary note 1, preferably, the cycle further includes: (b-4) exhausting the halogen-based source gas; (b-5) exhausting the first reactive gas; and (b-6) exhausting the second reactive gas, and the steps (b-1), (b-4), (b-2), (b-5), (b-3) and (b-6) are sequentially performed in the cycle.

Supplementary Note 3

In the method of Supplementary note 1, preferably, the cycle further includes: (b-4) exhausting the halogen-based source gas; and (b-5) exhausting the second reactive gas, and the steps (b-1), (b-4), (b-2), (b-3) and (b-5) are sequentially performed in the cycle.

Supplementary Note 4

In the method of Supplementary note 1, preferably, the cycle further includes: (b-4) exhausting the halogen-based source gas; (b-5) exhausting the first reactive gas; and (b-6) exhausting the second reactive gas, and, in the cycle, a first cycle including the steps (b-1), (b-4), (b-2) and (b-5) in sequence is performed a first number of times to form a first film including the first element and the second element, and a second cycle including the steps (b-1), (b-4), (b-3) and (b-6) in sequence is then performed a second number of times to form a second film including the first element and the third element.

Supplementary Note 5

In the method of Supplementary note 1, preferably, the cycle further includes: (b-4) exhausting the halogen-based source gas; (b-5) exhausting the first reactive gas; and (b-6) exhausting the second reactive gas, and, in the cycle, a first cycle including the steps (b-1), (b-4), (b-2), (b-5), (b-3) and (b-6) in sequence is performed a first number of times to form a first film including the first element, the second element and the third element, and a second cycle including the steps (b-1), (b-4), (b-2) and (b-5) in sequence is then performed a second number of times to form a second film including the first element and the second element.

Supplementary Note 6

In the method of Supplementary note 1, preferably, the cycle further includes: (b-4) exhausting the halogen-based source gas; (b-5) exhausting the first reactive gas; and (b-6) exhausting the second reactive gas, and, in the cycle, a first cycle including the steps (b-1), (b-4), (b-2), (b-3) and (b-6) in sequence is performed a first number of times to form a first film including the first element, the second element and the third element, and a second cycle including the steps (b-1), (b-4), (b-2) and (b-5) in sequence is then performed a second number of times to form a second film including the first element and the second element.

Supplementary Note 7

In the method of any one of Supplementary notes 1 through 6, preferably, the first element includes a metal element.

Supplementary Note 8

In the method of Supplementary note 7, preferably, the metal element is selected from a group consisting of titanium (Ti), tantalum (Ta), tungsten (W), hafnium (Hf), zirconium (Zr), aluminum (Al), cobalt (Co), yttrium (Y), ruthenium (Ru) and molybdenum (Mo), and the halogen-based source gas is selected from a group consisting of a titanium-containing gas, a tantalum-containing gas, a tungsten-containing gas, a hafnium-containing gas, a zirconium-containing gas, an aluminum-containing gas, a cobalt-containing gas, a yttrium-containing gas, a ruthenium-containing gas and a molybdenum-containing gas.

Supplementary Note 9

In the method of Supplementary note 8, preferably, the halogen-based source gas is selected from a group consisting of titanium tetrafluoride ($TiF_4$), titanium tetrabromide ($TiBr_4$), titanium tetraiodide ($TiI_4$), tantalum pentachloride ($TaCl_5$), tantalum pentafluoride ($TaF_5$), tantalum pentabromide ($TaBr_5$), tantalum pentaiodide ($TaI_5$), tungsten hexachloride ($WCl_6$), tungsten hexafluoride ($WF_6$), tungsten hexabromide ($WBr_6$), tungsten hexaiodide ($WI_6$), hafnium tetrachloride ($HfCl_4$), hafnium tetrafluoride ($HfF_4$), hafnium tetrabromide ($HfBr_4$), hafnium tetraiodide ($HfI_4$), zirconium tetrachloride ($ZrCl_4$), zirconium tetrafluoride ($ZrF_4$), zirconium tetrabromide ($ZrBr_4$), zirconium tetraiodide ($ZrI_4$), aluminum trichloride ($AlCl_3$), aluminum trifluoride ($AlF_3$), aluminum tribromide ($AlBr_3$), aluminum triiodide ($AlI_3$), cobalt dichloride ($CoCl_2$), cobalt difluoride ($CoF_2$), cobalt dibromide ($CoBr_2$), cobalt diiodide ($CoI_2$), yttrium trichloride ($YCl_3$), yttrium trifluoride ($YF_3$), yttrium tribromide ($YBr_3$), yttrium triiodide ($YI_3$), ruthenium trichloride ($RuCl_3$), ruthenium trifluoride ($RuF_3$), ruthenium tribromide ($RuBr_3$) and ruthenium triiodide ($RuI_3$).

Supplementary Note 10

In the method of any one of Supplementary notes 7 through 9, preferably, a work function of the film is adjusted (controlled, modulated or tuned) by controlling (adjusting or tuning) concentrations of the second element and the third element in the film from the first reactive gas supplied in the step (b-2) and the second reactive gas supplied in the step (b-3), respectively.

Supplementary Note 11

In the method of Supplementary note 10, preferably, the concentration of the third element in the film is controlled (adjusted or tuned) by controlling (adjusting or tuning) an amount of the second reactive gas supplied in the step (b-3).

Supplementary Note 12

In the method of Supplementary note 11, preferably, the concentration of the third element in the film is controlled (adjusted or tuned) by controlling (adjusting or tuning) a pressure of the second reactive gas supplied in the step (b-3)

Supplementary Note 13

In the method of any one of Supplementary notes 1 through 12, preferably, each of the second element and the third element includes a group 15 element Supplementary Note 14

In the method of Supplementary note 13, preferably, an electronegativity of the third element is lower than that of the second element.

Supplementary Note 15

In the method of Supplementary note 14, preferably, the second element includes nitrogen, and the first reactive gas includes a nitrogen-containing gas.

Supplementary Note 16

In the method of Supplementary note 15, preferably, the third element is selected from a group consisting of phosphorus (P), arsenic (As), antimony (Sb) and bismuth (Bi), and the second reactive gas is selected from a group consisting of a phosphorus-containing gas, an arsenic-containing gas, an antimony-containing gas and a bismuth-containing gas.

Supplementary Note 17

In the method of Supplementary note 16, preferably, the second reactive gas is selected from a group consisting of phosphorus trihydride (phosphine, $PH_3$), arsenic trihydride (arsine, $AsH_3$), antimony trihydride (stibine, $SbH_3$) and bismuth trihydride (bismuthine, $BiH_3$).

Supplementary Note 18

In the method of Supplementary note 17, preferably, the first reactive gas includes ammonia ($NH_3$), the third element includes phosphorus (P), and second reactive gas includes phosphorus trihydride (phosphine, $PH_3$).

Supplementary Note 19

In the method of Supplementary note 14, preferably, the cycle further includes: (b-4) exhausting the halogen-based source gas; (b-5) exhausting the first reactive gas; and (b-6) exhausting the second reactive gas, and the steps (b-1), (b-4), (b-3), (b-6), (b-2) and (b-5) are sequentially performed in the cycle.

Supplementary Note 20

In the method of Supplementary note 14, preferably, the cycle further includes: (b-4) exhausting the halogen-based source gas; and (b-5) exhausting the first reactive gas, and the steps (b-1), (b-4), (b-3), (b-2) and (b-5) are sequentially performed in the cycle.

Supplementary Note 21

According to another aspect of the present invention, there is provided a method of manufacturing a semiconductor device or a substrate processing method, the method including: (a) accommodating a substrate in a process chamber; (b) forming a film including a first element, a second element and a third element in a same group as the second element on the substrate by performing a cycle a predetermined number of times, the cycle including: (b-1) supplying a halogen-based source gas including the first element to the substrate; and (b-2) supplying a mixture of a first reactive gas including the second element and a second reactive gas including the third element, wherein the steps (b-1) and (b-2) are performed time-divisionally (asynchronously, intermittently or pulsewisely) in the cycle; and (c) unloading the substrate from the process chamber.

Supplementary Note 22

In the method of Supplementary note 21, preferably, the first reactive gas and the second reactive gas are premixed, and the mixture of the first reactive gas and the second reactive gas is supplied to the substrate.

Supplementary Note 23

According to still another aspect of the present invention, there is provided a substrate processing apparatus including: a process chamber configured to accommodate a substrate; a gas supply system configured to supply a halogen-based source gas including a first element, a first reactive gas including a second element and a second reactive gas including a third element in a same group as the second element into the process chamber; a control unit configured to control the gas supply system to form a film including the first element, the second element and the third element on the substrate by performing a cycle a predetermined number of times, the cycle including: (a) supplying the halogen-based source gas to the substrate; (b) supplying the first reactive gas to the substrate; and (c) supplying the second reactive gas to the substrate, wherein the steps (a), (b) and (c) are performed time-divisionally (asynchronously, intermittently or pulsewisely) in the cycle.

Supplementary Note 24

According to still another aspect of the present invention, there is provided a substrate processing apparatus including: a process chamber configured to accommodate a substrate; a gas supply system configured to supply a halogen-based source gas including a first element, a first reactive gas including a second element and a second reactive gas including a third element in a same group as the second element into the process chamber; a control unit configured to control the gas supply system to form a film including the first element, the second element and the third element on the substrate by performing a cycle a predetermined number of times, the cycle including: (a) supplying the halogen-based source gas to the substrate; and (b) supplying a mixture of the first reactive gas and the second reactive gas to the substrate, wherein the steps (a) and (b) are performed time-divisionally (asynchronously, intermittently or pulsewisely) in the cycle.

Supplementary Note 25

In the substrate processing apparatus of Supplementary note 24, preferably, the gas supply system includes: a halogen-based source gas supply pipe connected to the process chamber and configured to supply the halogen-based source gas into the process chamber; a reactive gas supply pipe connected to the process chamber and configured to supply the first reactive gas and the second reactive gas into the process chamber.

Supplementary Note 26

According to still another aspect of the present invention, there is provided a program or a non-transitory computer-readable recording medium storing a program for causing a computer to perform: (a) accommodating a substrate in a process chamber; (b) forming a film including a first element, a second element and a third element in a same group as the second element on the substrate by performing a cycle a predetermined number of times, the cycle including: (b-1) supplying a halogen-based source gas including the first element to the substrate; (b-2) supplying a first reactive gas including the second element; and (b-3) supplying a second reactive gas including the third element, wherein the steps (b-1), (b-2) and (b-3) are performed time-divisionally (asynchronously, intermittently or pulsewisely) in the cycle; and (c) unloading the substrate from the process chamber.

Supplementary Note 27

According to still another aspect of the present invention, there is provided a program or a non-transitory computer-readable recording medium storing a program for causing a computer to perform: (a) accommodating a substrate in a process chamber; (b) forming a film including a first element, a second element and a third element in a same group as the second element on the substrate by performing a cycle a predetermined number of times, the cycle including: (b-1) supplying a halogen-based source gas including the first element to the substrate; (b-2) supplying a mixture of a first reactive gas including the second element and a second reactive gas including the third element, wherein the steps (b-1) and (b-2) are performed time-divisionally (asynchronously, intermittently or pulsewisely) in the cycle; and (c) unloading the substrate from the process chamber.

What is claimed is:

1. A method of manufacturing a semiconductor device, comprising:
    (a) providing a substrate; and
    (b) forming a film comprising titanium, nitrogen, and phosphorus on the substrate by performing a cycle a predetermined number of times, the cycle comprising:
        (b-1) supplying a chlorine-containing source gas including titanium to the substrate; (b-2) supplying a nitrogen-containing gas, wherein the nitrogen-containing gas is reactive with the chlorine-containing source gas; (b-3) supplying a phosphorus-containing gas without mixing the phosphorus-containing gas with the nitrogen-containing gas; (b-4) exhausting the chlorine-containing source gas; (b-5) exhausting the nitrogen-containing gas; and (b-6) exhausting the phosphorus-containing gas, wherein (b-1), (b-4), (b-2), (b-5), (b-3) and (b-6) are sequentially performed, and the cycle further comprises: a first cycle wherein (b-1), (b-4), (b-2), (b-5), (b-3), and (b-6) are sequentially performed a first number of times to form a first film comprising titanium, nitrogen and phosphorus; and a second cycle wherein (b-1), (b-4), (b-2), and (b-5) are sequentially performed a second number of times to form a second film comprising titanium and nitrogen after performing the first cycle, and wherein the phosphorus-containing gas is reactive with the chlorine-containing source gas and unreactive with the nitrogen-containing gas.

2. The method of claim 1, wherein a work function of the film is adjusted by controlling concentrations of nitrogen and phosphorus in the film from the nitrogen-containing gas and the phosphorus-containing gas, respectively.

3. The method of claim 2, wherein the concentration of phosphorus in the film is controlled by adjusting an amount of the nitrogen-containing gas supplied in (b-2).

4. The method of claim 2, wherein the concentration of phosphorus in the film is controlled by adjusting a pressure of the phosphorus-containing gas supplied in (b-3).

5. A method of manufacturing a semiconductor device, comprising:

(a) providing a substrate; and
(b) forming a film comprising titanium, phosphorus and nitrogen on the substrate by performing a cycle a predetermined number of times, the cycle comprising: (b-1) supplying a chlorine-containing source gas including titanium to the substrate; (b-2) supplying a phosphorus-containing gas, wherein the phosphorus-containing gas is reactive with the chlorine-containing source gas; (b-3) supplying a nitrogen-containing gas without mixing the nitrogen-containing gas with the phosphorus-containing gas; (b-4) exhausting the chlorine-containing source gas; (b-5) exhausting the phosphorus-containing gas; and (b-6) exhausting the nitrogen-containing gas, wherein (b-1), (b-4), (b-2), (b-5), (b-3), and (b-6) are sequentially performed and the cycle further comprises: a first cycle wherein (b-1), (b-4), (b-2), (b-5), (b-3), and (b-6) are sequentially performed a first number of times to form a first film comprising titanium, phosphorus and nitrogen; and a second cycle wherein (b-1), (b-4), (b-3) and (b-5) are sequentially performed a second number of times to form a second film comprising titanium and nitrogen after performing the first cycle, wherein the phosphorus-containing gas is reactive with the chlorine-containing source gas and unreactive with the nitrogen-containing gas.

6. The method of claim 5, wherein a work function of the film is adjusted by controlling concentrations of nitrogen and phosphorus in the film from the nitrogen-containing gas and the phosphorus-containing gas, respectively.

7. The method of claim 6, wherein the concentration of phosphorus in the film is controlled by adjusting an amount of the phosphorous-containing gas supplied in (b-2).

* * * * *